(12) United States Patent
Tejeda Ferrari et al.

(10) Patent No.: US 11,881,440 B2
(45) Date of Patent: Jan. 23, 2024

(54) CARBON BASED POLYMER THERMAL INTERFACE MATERIALS WITH POLYMER CHAIN TO CARBON BASED FILL PARTICLE BONDS

(71) Applicant: INTEL CORPORATION, Santa Clara, CA (US)

(72) Inventors: Marely E. Tejeda Ferrari, Phoenix, AZ (US); Taylor Gaines, Chandler, AZ (US); Elah Bozorg-Grayeli, Chandler, AZ (US); James C. Matayabas, Jr., Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 824 days.

(21) Appl. No.: 16/798,118

(22) Filed: Feb. 21, 2020

(65) Prior Publication Data
US 2021/0265238 A1    Aug. 26, 2021

(51) Int. Cl.
| | | |
|---|---|---|
| *H01L 23/373* | (2006.01) | |
| *H01L 21/48* | (2006.01) | |
| *H01L 23/367* | (2006.01) | |
| *H01L 23/42* | (2006.01) | |
| *C08K 3/04* | (2006.01) | |
| *C09K 5/14* | (2006.01) | |

(52) U.S. Cl.
CPC .......... *H01L 23/3737* (2013.01); *C08K 3/041* (2017.05); *C08K 3/042* (2017.05); *C09K 5/14* (2013.01); *H01L 21/4871* (2013.01); *H01L 23/367* (2013.01); *H01L 23/42* (2013.01); *C08K 2201/001* (2013.01); *C08K 2201/011* (2013.01)

(58) Field of Classification Search
CPC ...... C08K 3/00; C08K 13/00; C08K 2201/00; C08K 3/041; C08K 3/042; C08K 2201/001; C08K 2201/011; C09K 5/00; C09K 5/14; H01L 21/00; H01L 23/00; H01L 21/04; H01L 21/4814; H01L 21/4871; H01L 23/4012; H01L 2023/4018; H01L 2023/4025; H01L 2023/4031; H01L 23/10; H01L 23/36; H01L 23/367; H01L 23/373; H01L 23/3737; H01L 23/40; H01L 23/42; H10N 70/861; H10N 70/8613; H10N 70/8845; H10N 10/85; H10N 10/856; H10N 10/857; H10N 10/00; H10N 70/00; C08L 75/04; C08L 83/04
USPC ....................................................... 257/713
See application file for complete search history.

(56) References Cited

U.S. PATENT DOCUMENTS

| | | | | |
|---|---|---|---|---|
| 2001/0009129 | A1* | 7/2001 | Kunita .................. | B41C 1/1016 101/453 |
| 2004/0238947 | A1* | 12/2004 | Rumer .................... | H01L 23/40 257/E23.083 |
| 2006/0079454 | A1* | 4/2006 | Reches .................... | H01J 19/24 530/300 |
| 2007/0265379 | A1* | 11/2007 | Chen ........................ | C08K 7/24 524/495 |

(Continued)

*Primary Examiner* — Herve-Louis Y Assouman
(74) *Attorney, Agent, or Firm* — Essential Patents Group, LLP

(57) ABSTRACT

Microelectronic devices, assemblies, and systems include a microelectronic die and composite material to conduct heat from the microelectronic die such that the composite material includes polymer chains chemically bonded to fill particles having a hexagonal lattice of carbon atoms such as graphene sheet fill particles and/or carbon nanotube fill particles.

18 Claims, 13 Drawing Sheets

(56) References Cited

U.S. PATENT DOCUMENTS

| | | | | |
|---|---|---|---|---|
| 2008/0291634 A1* | 11/2008 | Weiser | ............... | H01L 23/42 |
| | | | | 361/708 |
| 2009/0123712 A1* | 5/2009 | Sugasaki | ............... | B41C 1/05 |
| | | | | 430/286.1 |
| 2009/0220753 A1* | 9/2009 | Sugasaki | ............... | B41N 1/12 |
| | | | | 430/285.1 |
| 2011/0214284 A1* | 9/2011 | Xu | ............... | C09K 5/00 |
| | | | | 427/256 |
| 2012/0182693 A1* | 7/2012 | Boday | ............... | H01L 23/3737 |
| | | | | 252/78.3 |
| 2013/0137054 A1* | 5/2013 | Jiang | ............... | C08F 220/54 |
| | | | | 137/67 |
| 2014/0197354 A1* | 7/2014 | Olson | ............... | B82Y 30/00 |
| | | | | 252/74 |
| 2014/0264820 A1* | 9/2014 | Hu | ............... | H01L 23/3736 |
| | | | | 257/713 |
| 2015/0014577 A1* | 1/2015 | Chowdhury | ............... | H01L 23/40 |
| | | | | 257/E23.083 |
| 2018/0014431 A1* | 1/2018 | Xu | ............... | H01L 23/40 |
| | | | | 257/E23.083 |

* cited by examiner

CARBON BASED POLYMER THERMAL INTERFACE MATERIALS WITH POLYMER CHAIN TO CARBON BASED FILL PARTICLE BONDS

BACKGROUND

As computing devices continue to get smaller and more powerful, thermal management presents new challenges. System-level thermal solutions, such as heat spreaders and heat sinks, are commonly coupled with a microelectronic die (also referred to as an integrated circuit (IC) die) through the use of a thermal interface material (TIM), which transports heat generated by the microelectronic die and dissipates the heat to the external environment. In addition, multi-chip packages may include multiple dice with a mix of TIM solutions. These can include polymer TIMs (PTIM) and solder TIMs (STIM). Notably, STIM processing requires a flux material to form a connection between the solder and the die. Unfortunately, PTIM cure is inhibited by flux, which makes it unsuitable for use in conjunction with the STIM process. Furthermore, current PTIMs exhibit thermal performance limitations.

Therefore, there is a need for TIM solutions that provide improved thermal performance and, in some contexts, resistance to flux used in STIM processing. It is with respect to these and other considerations that the present improvements have been needed. Such improvements are highly needed as the desire to improve computing device performance and the corresponding necessity to remove heat from such devices continues.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
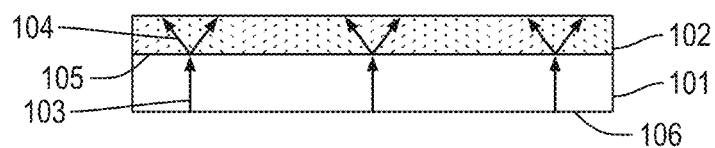
FIG. 1 illustrates a side view of a microelectronic device including a composite thermal interface material.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As described further below, a thermal interface material (TIM) is provided as a composite material such that the composite material includes polymer chains chemically bonded to fill particles having a hexagonal lattice of carbon atoms. The composite TIM described herein may be characterized as a polymer TIM (PTIM) with a carbon based fill as the bulk material of the TIM is polymer. Example bulk polymer materials include polydimethylsiloxane, epoxy, and polyurethane. Furthermore, the composite TIM includes fill particles, which include hexagonal lattices of carbon atoms. Such fill particles including hexagonal lattices of carbon atoms are also referenced as carbon lattice based fill particles, carbon based fill particles, and so on. Example fill particles include graphene sheets (or simply graphene) and carbon nanotubes, including single wall carbon nanotubes and/or multiwall carbon nanotubes. As discussed herein, the fill particles include functional groups such as alcohols (i.e., alcohol functional groups), carboxylic acids (i.e., carboxyl functional groups), amines (i.e., amine functional groups), or combinations thereof. During cure, the composite material, including unbonded polymer chains and functionalized carbon lattice based fill particles, covalently bond to form chemical (covalent) bonds via the functional groups of the functionalized carbon lattice based fill particles and suitable reactive groups of the unbonded polymer chains. Thereby, the cured composite TIM includes carbon lattice based fill particles that are chemically (covalently) bonded to polymer chains. For example, the carbon lattice based fill particles may be cross-linked with the polymer chains. Furthermore, the polymer chains also cross link and bond with one another during cure to form the bulk polymer material.

Such chemically bonded composite TIMs having covalent bonds between the polymer chains and the carbon lattice based fill particles provide advantages including improved wetting of the fill particles by the polymer chains. Such improved wetting of the carbon based fill particles by the bulk polymer material (e.g., resin) improves thermal conductivity at a given fill particle concentration and provides the ability to increase the fill particles concentration in the composite TIM. Such improvements in increased concentration, in turn, provides further improved thermal conductivity as well as the ability to provide other desirable material properties such as hardness, adhesion, and so on. Notably, the composite TIMs described herein have improved thermal conductivity (at the same load pressure) relative to PTIMs having other fill particles such as aluminum, unbonded graphite, and unbonded graphene. Furthermore, the composite TIMs as described herein provide suitable bond line thickness, heat spreading, elongation, adhesive strength, and hardness for use in a variety of microelectronic die assembly and packaging contexts.

FIG. 1 illustrates a side view of a microelectronic device 100 including a composite thermal interface material 102, in accordance with some embodiments. As shown in FIG. 1, microelectronic device 100 includes a microelectronic die 101 and composite thermal interface material (TIM) 102 to conduct heat 103 from microelectronic die 101. As used herein, the term composite TIM indicates a material including at least two components, parts, or elements. A composite TIM as discussed herein includes polymer chains as a first component and fill particles having hexagonal lattices of carbon atoms as a second component such that the polymer chains and fill particles are chemically bonded.

Microelectronic die 101 may be any type of microelectronic device, integrated circuit (IC), etc. for performing any suitable computing or device function. For example, microelectronic die 101 may be a a microprocessor, a controller, a field programmable gate array (FPGA), an application specific IC (ASIC), a system-on-chip (SOC), an electronic memory chip (e.g., DRAM, flash memory, etc.), a graphics processor, an artificial intelligence (AI) accelerator, etc. Microelectronic die 101 may be characterized as a chip, a die, an IC die, or the like. Furthermore, microelectronic device 100 may be implemented in any suitable form factor device, platform, etc. For example, microelectronic device 100 may be implemented in any of a personal computer, a laptop computer, a tablet, a phablet, a smart phone, a digital camera, a gaming console, a wearable device, a set top device, a server, a cloud computing environment, etc. Microelectronic device 100 and other devices and systems herein may be characterized as IC packages, IC assemblies, etc. Although such packages and assemblies are illustrated with respect to single chip or die implementations, composite TIM 102 may be implemented in multi-chip assemblies, interposer assemblies, etc.

In the illustrated embodiment, composite TIM 102 is on a surface 105 of microelectronic die 101 that is opposite a surface 106 of microelectronic die 101. For example, surface 106 may be attached to a package substrate, motherboard, or the like. However, composite TIM 102 may be implemented on or adjacent microelectronic die 101 in any manner to remove heat 103 from microelectronic die 101. For example, a material layer may be between composite TIM 102 and surface 105, composite TIM 102 may be additionally provided on sides of microelectronic die 101, on both surfaces 105, 106 of microelectronic die 101, etc. Furthermore, composite TIM 102 may be thermally coupled to a heat spreader, heat sink, cool plate, heat pipe, or other thermal solution or heat dissipation device for removal of heat 103. As shown, heat 103 (illustrated with respect to arrows, only one of which is labeled for the sake of clarity) generated by microelectronic die 101 is removed therefrom and dissipated through composite TIM 102 via heat dissipation 104. Such heat removal provides for improved performance of microelectronic die 101.

Figure 2:
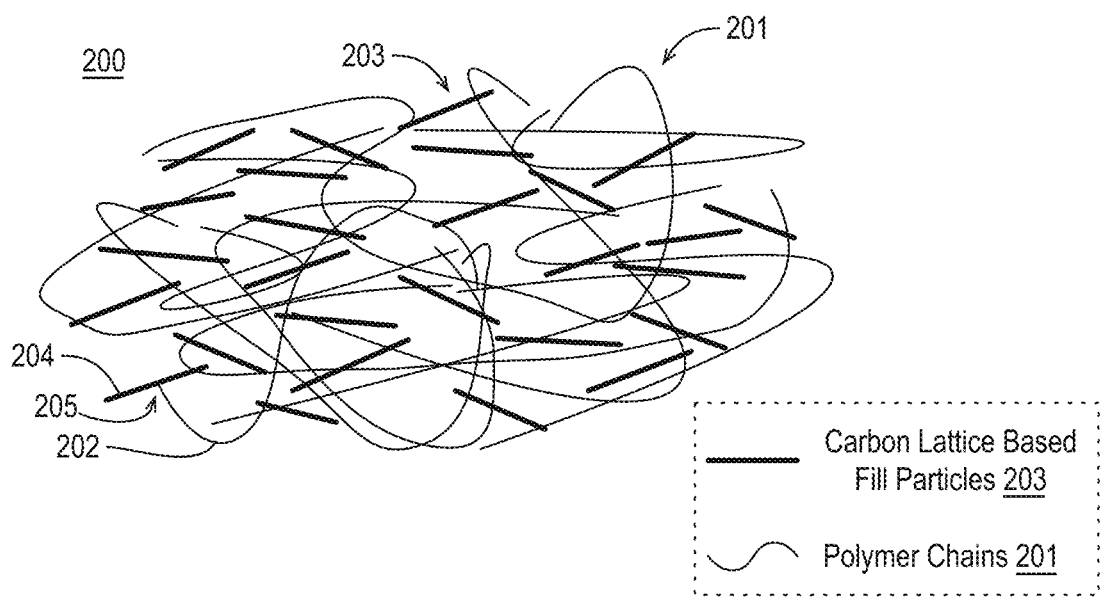
FIG. 2 illustrates a depiction of an exemplary composite thermal interface material.

FIG. 2 illustrates a depiction of an exemplary composite thermal interface material 200, in accordance with some embodiments. Composite TIM 200 may be implemented in any composite TIM context discussed herein such as with respect to composite TIMs 102, 710, 810, etc. As shown in FIG. 2, composite TIM 200 includes carbon lattice based fill particles 203 chemically bonded to polymer chains 201 in a relatively randomized pattern throughout composite TIM 200. Notably, polymer chains 201 are also chemically bonded to one another and cross-linked throughout composite TIM 200. Furthermore, not all of carbon lattice based fill particles 203 may be chemically bonded to a polymer chain of polymer chains 201; during cure some may fail to chemically bond.

As discussed, carbon lattice based fill particles 203 include, prior to cure, carbon lattices and functional groups. As used herein, the term carbon lattice or hexagonal carbon lattice indicates a lattice of carbon atoms covalently bonded to one another in a hexagonal lattice formation, as is found in graphene and carbon nanotube preparations. Notably, such hexagonal carbon lattices include hundreds or thousands or more (e.g., not fewer than one hundred carbon atoms, not fewer than three hundred carbon atoms, not fewer than five hundred carbon atoms, or not fewer than one thousand carbon atoms). Hexagonal carbon lattices may be differentiated from organic compounds including benzene rings, naphthalene, etc. in terms of the extended lattice structures that include dozens, hundreds, or more hexagons of carbon atoms each interlocking in a lattice structure and in terms of the number of carbon atoms in the lattice structure.

As discussed, carbon lattice based fill particles 203, again prior to cure, also include functional groups such as alcohol groups, carboxyl groups, or amine groups. As used herein, the term functional group indicates a group of atoms that are responsible for a characteristic chemical reaction. The term functionalized indicates a carbon lattice based fill particle including one or more such functional groups. Some such functional groups may remain in carbon lattice based fill particles 203 after cure. That is, not all functional groups are expected to react. During cure, others of the functional groups react with a reactive group of a polymer chain to form chemical bonds therebetween. As used herein, the term chemical bond indicates an instance of an attraction between one of carbon lattice based fill particles 203 and one of polymer chains 201. For example, covalent chemical bonds may be formed during cure, optionally with use of a curing agent or catalyst, by reacting a functional group of the fill particle with the reactive group of the polymer chain to produce the covalent bond (and, typically, a byproduct). Such chemical bonds are discussed further herein below.

For example, as shown with respect to polymer chain 202 and carbon lattice based fill particle 204, a chemical bond 205 is provided therebetween. As illustrated, such chemical bonds may often be at the end of a polymer chain (where reactive groups are often provided) and at any location of a carbon lattice based fill particle where a functional group was available for reaction. In the illustrated example, a single polymer chain 202 is chemically bonded to a single carbon lattice based fill particle 204. In other examples, multiple polymer chains are chemically bonded to a single carbon lattice based fill particle 204. Furthermore, a single polymer chain may have multiple carbon lattice based fill particle chemically bonded thereto (e.g., one at each end or at some or all of available reactive sites of the polymer chain). Furthermore, polymer chains 201 may be cross-linked and bonded to one another in myriad ways such that polymer chains 201 and carbon lattice based fill particles 203 provide relatively uniform overall composite material properties while local chemical bonding, polymer orientation, and so on may be relatively random.

Carbon lattice based fill particles 203 may include any material having an ordered hexagonal lattice of carbon atoms. In some embodiments, carbon lattice based fill particles 203 include graphene sheets. As used herein, the term graphene sheet indicates a single layer of a hexagonal carbon lattice. As discussed, in composite TIM 200, a graphene sheet is chemically bonded to a polymer chain by use of a functional group. A graphene sheet in composite TIM 200 (after cure) may also include unreacted functional groups. Therefore, in some embodiments, carbon lattice based fill particles 203 include graphene sheets having functional groups and may therefore be characterized as functionalized graphene or a functionalized graphene sheet.

In other embodiments, carbon lattice based fill particles 203 include carbon nanotubes. As used herein, the term carbon nanotube indicates a tube made up of a hexagonal carbon lattice or tubes of hexagonal carbon lattices. Furthermore, the term carbon nanotube is inclusive of single wall carbon nanotubes and multiwall carbon nanotubes. As discussed, in composite TIM 200, a carbon nanotube is chemically bonded to a polymer chain by use of a functional group. However, as with graphene sheets, the carbon nanotube in composite TIM 200 may also include unreacted functional groups and such carbon nanotubes having functional groups and may be characterized as functionalized carbon nanotubes.

In some embodiments, multiple types of carbon lattice based fill particles 203 may be used. For example, graphene sheets and carbon nanotubes may be implemented, as is discussed further herein. It is noted that non-carbon lattice based fill particles (such as metal particles) may be implemented in addition to carbon lattice based fill particles 203. Furthermore, polymer chains 201 may include any suitable polymer chain having one or more reactive groups to react with the functional groups of carbon lattice based fill particles 203. In some embodiments, polymer chains 201 include polydimethylsiloxane chains. In some embodiments, polymer chains 201 include epoxy polymer chains. In some embodiments, polymer chains 201 include polyurethane polymer chains. Combinations of such polymer chains 201 and carbon lattice based fill particles 203 are discussed further herein below.

As discussed, chemically bonding polymer chains 201 with carbon lattice based fill particles 203 increases wetting of the carbon lattice based fill particles 203 in composite TIM 102 for improved thermal conductivity. In some embodiments, composite TIM 200 has a thermal conductivity in the range of 2 to 4 W/mK. In some embodiments, carbon lattice based fill particles 203 are provided within composite TIM 102 at a concentration of not less than 10% carbon lattice based fill particles 203 by volume with a concentration of not less than 20% carbon lattice based fill particles 203 by volume being particularly advantageous. In some embodiments, composite TIM 200 has a concentration of carbon lattice based fill particles in the range of 20% to 30% by volume.

Discussion now turns to exemplary combinations of polymer chains and functionalized carbon lattice based fill particles for implementation in composite TIMs.

Figure 3:
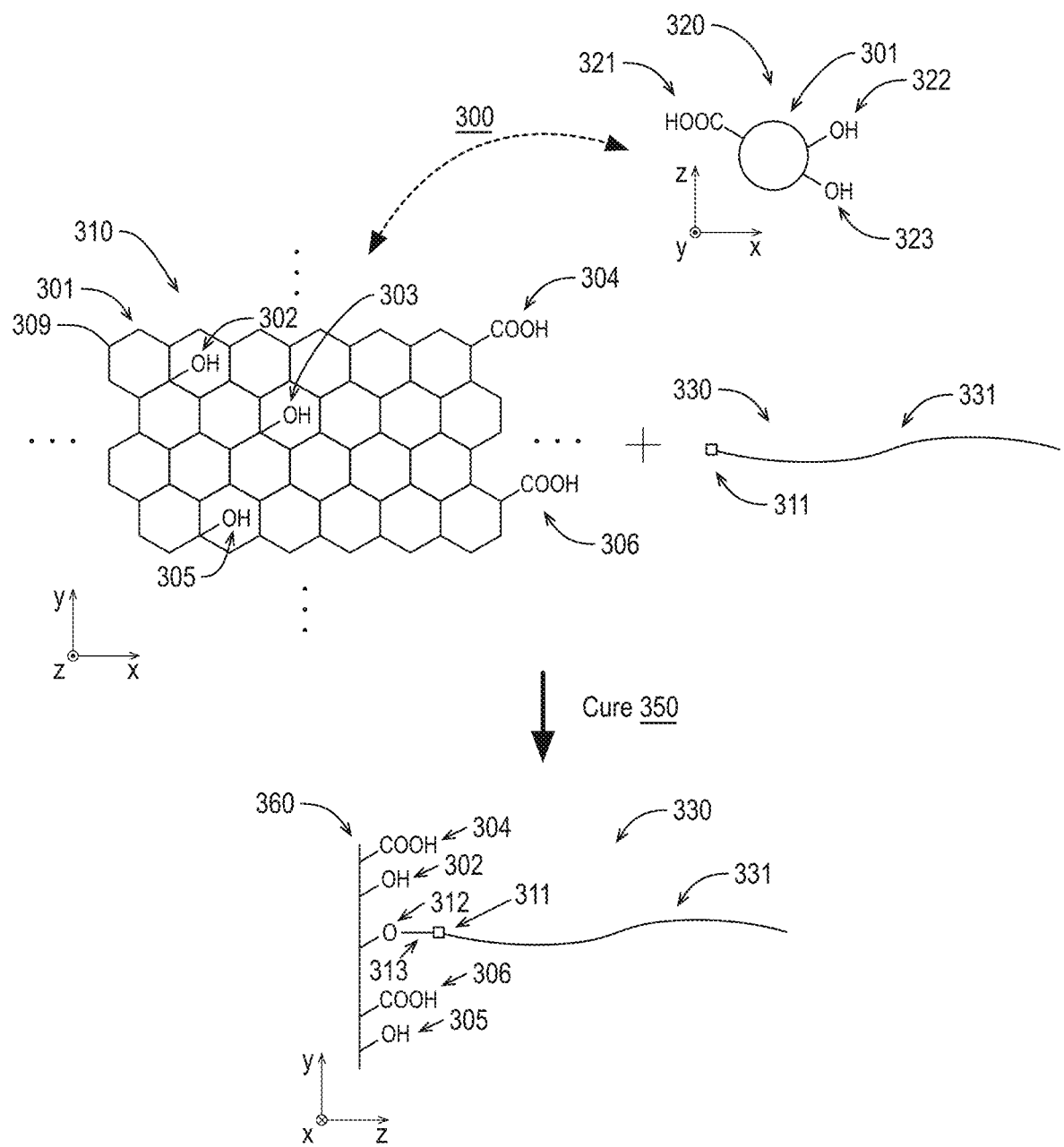
FIG. 3 illustrates a depiction of forming an exemplary chemical bond between an example carbon lattice based fill particle and an example polymer chain via a hydroxyl functional group.

FIG. 3 illustrates a depiction of forming an exemplary chemical bond between an example carbon lattice based fill particle and an example polymer chain via a hydroxyl functional group, in accordance with some embodiments.

For example, a functionalized graphene sheet fill particle 310 or a functionalized carbon nanotube fill particle 320 may react with a polymer chain 330 to form a covalent bond therebetween. In the illustration of FIG. 3, functionalized graphene sheet fill particle 310 is shown reacting with polymer chain 330 for the sake of clarity of presentation. However, it will be appreciated that either functionalized graphene sheet fill particle 310 or functionalized carbon nanotube fill particle 320 (as shown with respect to replacement 300) or both may be reacted with polymer chain 330 to form a covalent bond therebetween in analogy to the depicted chemical bond.

As shown in FIG. 3, functionalized graphene sheet fill particle 310 includes a hexagonal lattice of carbon atoms 301. Hexagonal lattice of carbon atoms 301 includes carbon atoms such as carbon atom 309 (each depicted as a vertex of a hexagonal ring) arranged in a hexagonal lattice such that a representative central carbon atom is covalently bonded to 3 other carbon atoms in a repeating pattern. Hexagonal lattice of carbon atoms 301 may include any number of such carbon atoms in a repeating pattern such as hundreds, thousands, or more. Similarly, functionalized carbon nanotube fill particle 320 includes hexagonal lattice of carbon atoms 301 in a tube construction or orientation. For example, the hexagonal lattice of carbon atoms illustrated with respect to functionalized graphene sheet fill particle 310 is provided in a tube formation (single or multi-wall) with respect to functionalized carbon nanotube fill particle 320.

In some embodiments, hexagonal lattice of carbon atoms 301 of functionalized graphene sheet fill particle 310 has a thickness (e.g., in the z-dimension) of about 2 nm and a minimum cross sheet dimension (e.g., in the x-y plane) of not less than 5 microns. As used herein, the term minimum cross sheet dimension with respect to a graphene sheet indicates a minimum length from one edge of the graphene sheet to an opposite edge of the graphene sheet through the centroid of the graphene sheet. For example, the cross sheet dimension may be characterized as a diameter of the graphene sheet though the graphene sheet may not be circular in shape. In some embodiments, the minimum cross sheet dimension is in the range of 5 to 10 microns. In some embodiments, the minimum cross sheet dimension is in the range of 15 to 20 microns. In some embodiments, the minimum cross sheet dimension is not less than 5 microns. In some embodiments, the minimum cross sheet dimension is not less than 15 microns.

In some embodiments, hexagonal lattice of carbon atoms 301 of functionalized carbon nanotube fill particle 320 has a diameter (e.g., in the x-z plane) in the range of 0.4 nm to 40 nm and a length (in the y-dimension) in the range of about 0.5 microns to 10 microns. In some embodiments, the length is not less than 2 microns. In some embodiments, the length is in the range of 2 to 12 microns.

As shown, functionalized graphene sheet fill particle 310, includes any number of functional groups 302-306 including a hydroxyl functional group 302 (i.e., —OH), a hydroxyl functional group 303, a carboxyl functional group 304 (i.e., —COOH), a hydroxyl functional group 305, and a carboxyl functional group 306. For example, functionalized graphene sheet fill particle 310 may be characterized as a graphene oxide sheet. In some embodiments, functionalized graphene sheet fill particle 310 may further include an oxygen with a single covalent bond to two adjacent carbon atoms of hexagonal lattice of carbon atoms 301; however, such oxygen atoms are not depicted for the sake of clarity of presentation. Similarly, functionalized carbon nanotube fill particle 320 includes any number of functional groups such as a carboxyl functional group 321, a hydroxyl functional group 322, and a hydroxyl functional group 323. In some embodiments, functionalized graphene sheet fill particle 310 and/or functionalized carbon nanotube fill particle 320 include about 2% oxygen by weight. In some embodiments, functionalized graphene sheet fill particle 310 and/or functionalized carbon nanotube fill particle 320 include not less than 1% oxygen by weight. In some embodiments, functionalized graphene sheet fill particle 310 and/or functionalized carbon nanotube fill particle 320 include not less than 2% oxygen by weight.

Furthermore, polymer chain 330 includes a reactive group 311 and a tail 331. Although illustrated with a single reactive group 311, polymer chain 330 may include multiple reactive groups (e.g., one on each end and/or branches with additional reactive groups). Reactive group 311 may be any suitable molecule portion that reacts in a predictable manner with respect to one or more of the functional groups of functionalized graphene sheet fill particle 310 and functionalized carbon nanotube fill particle 320. Tail 331 may a relatively long polymer chain comprising repeating non reactive molecular groups. Polymer chain 330 may be any suitable size. For example, polymer chain 330, as one of many polymer chains in a resin material, may have an average molecular weight in a wide range of about 500 to about 200,000 g/mol.

In the illustrated example, functionalized graphene sheet fill particle 310 and functionalized carbon nanotube fill particle 320 include both hydroxyl functional groups and carboxyl functional groups, which may be typical in their formation. However, in the context of FIG. 3, where hydroxyl functional group(s) are reacting, in some embodiments, functionalized graphene sheet fill particle 310 and functionalized carbon nanotube fill particle 320 are absent carboxyl functional groups. Notably, during cure 350, reactive group 311 reacts with one of functional groups 302-306, 321-323 based on the chemistry between reactive group 311 and functional groups 302-306, 321-323. For example, reactive group 311 may be reactive with one of hydroxyl functional groups or carboxyl functional groups depending on the chemistry of reactive group 311. As shown with respect to functionalized graphene sheet fill particle 310, cure 350 is then applied, optionally in the presence of a curing agent or catalyst, to provide chemical bond 313 between graphene sheet fill particle 360 and polymer chain 330. Cure 350 may include, for example, application of heat or UV. As discussed, cure 350 may also be applied to provide analogous chemical bonding between a carbon nanotube and polymer chain 330

In the example of FIG. 3, reactive group 311 is reactive with respect to any one of hydroxyl functional groups 302, 303, 305, 322, 323. Furthermore, in the illustrated example, reactive group 311 reacts with hydroxyl functional group 303 to form chemical bond 313 having a covalent bond via the oxygen atom 312 (O) of hydroxyl functional group 303. Notably, the hydrogen atom (H) has been released as a byproduct. Furthermore, one or more atoms of reactive group 311 may also be released as a byproduct of the covalent bond formed via oxygen atom 312. In the context of FIG. 3, polymer chain 330 may be any polymer chain having a reactive group 311 that is reactive with a hydroxyl functional group. In some embodiments, polymer chain 330 is a polydimethylsiloxane chain, an epoxy chain, or a polyurethane chain. In an embodiment, polymer chain 330 is polydimethylsiloxane with a silicon based reactive group 311 that reacts with hydroxyl functional group 303 to form chemical bond 313 such that oxygen atom 312 is covalently bonded to a silicon atom (not shown) of reactive group 311. Such material systems may be advantageous as providing a balance of thermal conductivity and other characteristics such as bond line thickness, heat spreading, elongation, adhesive strength, and hardness.

In some embodiments, the resultant composite TIM includes a bulk polydimethylsiloxane with graphene sheet fill particles having hydroxyl functional group(s) (unreacted) such that a polydimethylsiloxane chain is covalently bonded to a graphene sheet particle via an oxygen atom (from a reacted functional group). In some embodiments, the graphene sheet fill particles are 20% to 30% of the composite TIM by volume. In some embodiments, the resultant composite TIM includes a bulk polydimethylsiloxane with carbon nanotube fill particles having hydroxyl functional group(s) (unreacted) such that a polydimethylsiloxane chain is covalently bonded to a carbon nanotube fill particle via an oxygen atom (from a reacted functional group).

In the example of FIG. 3, only a single polymer chain 330 is shown reacting with a single hydroxyl functional group 303 to form a single chemical bond 313 between graphene sheet fill particle 360 and polymer chain 330. In other examples, multiple reactive groups of multiple polymer chains react with multiple hydroxyl functional groups of functionalized graphene sheet fill particle 310 or functionalized carbon nanotube fill particle 320. For example, some or all hydroxyl functional groups of functionalized graphene sheet fill particle 310 may react to form chemical bonds in analogy to chemical bond 313 such that graphene sheet fill particle 360 is chemically bonded to any number of polymer chains. Furthermore, after cure 350, graphene sheet fill particle 360 may still include functional groups such as hydroxyl functional groups 302, 305 and carboxyl functional groups 304, 306 such that graphene sheet fill particle 360 may still be characterized as functionalized with some functional groups unreacted. However, in some embodiments, each functional group of functionalized graphene sheet fill particle 310 may have reacted and no functionalized groups remain on graphene sheet fill particle 360.

Figure 4:
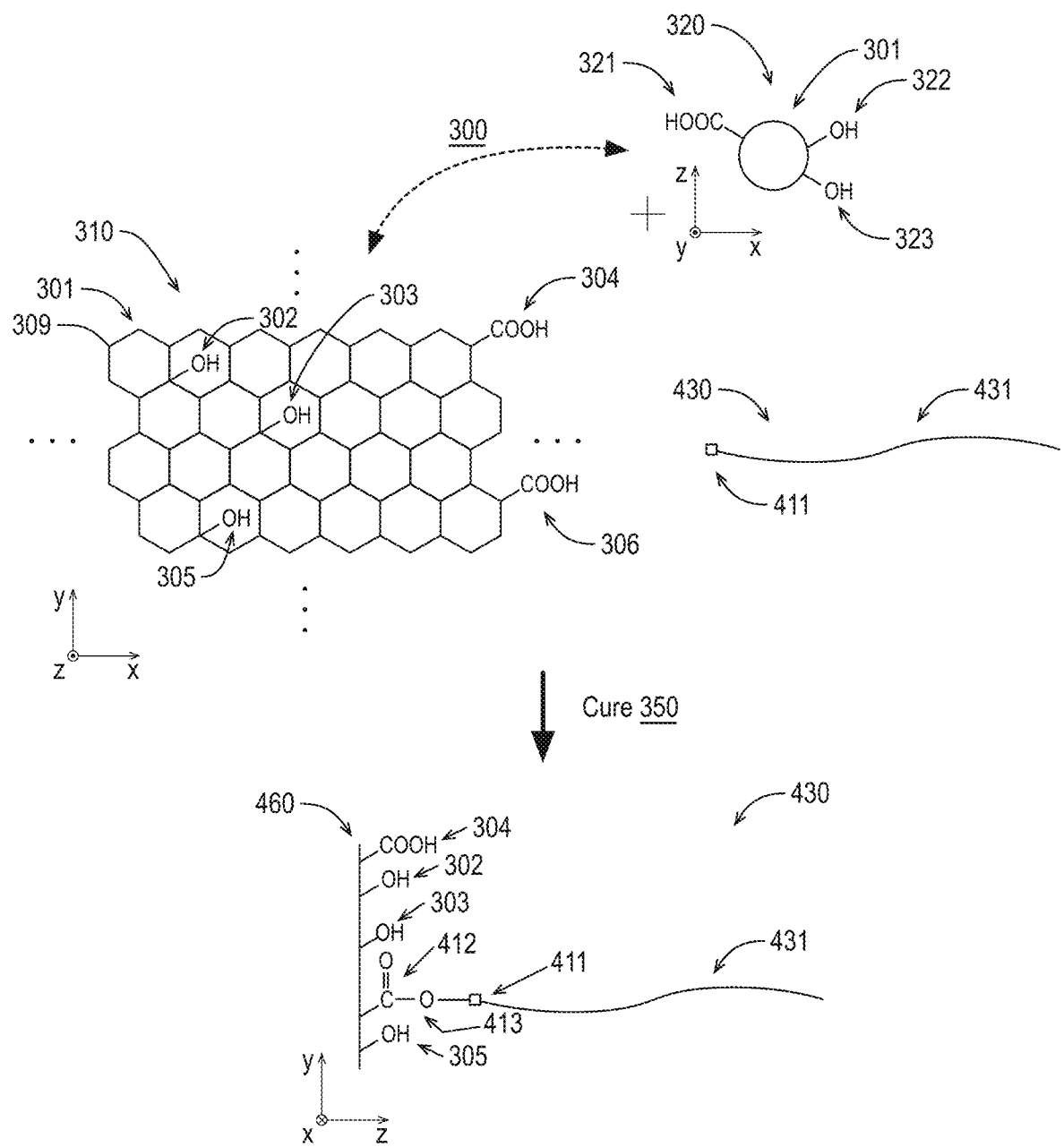
FIG. 4 illustrates a depiction of forming exemplary chemical bond between a carbon lattice based fill particle and a polymer chain via a carboxyl functional group.

FIG. 4 illustrates a depiction of forming exemplary chemical bond between a carbon lattice based fill particle and a polymer chain via a carboxyl functional group, in accordance with some embodiments. As discussed with respect to FIG. 3, functionalized graphene sheet fill particle 310 or functionalized carbon nanotube fill particle 320 may react with a polymer chain 430 to form a covalent bond therebetween. In FIG. 4, functionalized graphene sheet fill particle 310 is again shown reacting with polymer chain 430; however, either functionalized graphene sheet fill particle 310 or functionalized carbon nanotube fill particle 320 (as shown with respect to replacement 300) may be reacted with polymer chain 430 to form a covalent bond therebetween.

As shown in FIG. 4, functionalized graphene sheet fill particle 310 includes hexagonal lattice of carbon atoms 301, hydroxyl functional group 302, hydroxyl functional group 303, carboxyl functional group 304, hydroxyl functional group 305, and carboxyl functional group 306 as discussed with respect to FIG. 3. Similarly, functionalized graphene sheet fill particle 310 includes hexagonal lattice of carbon atoms 301 in a tube configuration, hydroxyl functional group 322, and a hydroxyl functional group 323. Furthermore, polymer chain 430 includes a reactive group 411 and a tail 431.

In the example of FIG. 4, functionalized graphene sheet fill particle 310 and functionalized carbon nanotube fill particle 320 again include both one or more hydroxyl functional groups and one or more carboxyl functional groups. However, in the context of FIG. 4, where carboxyl functional group(s) are reactive, in some embodiments, functionalized graphene sheet fill particle 310 and functionalized carbon nanotube fill particle 320 are absent hydroxyl functional groups and only include carboxyl functional groups. During cure 350, reactive group 411 reacts with one of functional groups 302-306 based on the chemistry between reactive group 411 and functional groups 302-306. In FIG. 4, reactive group 411 is reactive with only carboxyl functional groups. Although illustrated with respect to reactive group 311 (in FIG. 3) only being reactive with hydroxyl functional groups and reactive group 411 (in FIG. 4) only being reactive with carboxyl functional groups, in some embodiments a polymer reactive group may be reactive with both hydroxyl and carboxyl functional groups.

As shown with respect to functionalized graphene sheet fill particle 310, cure 350, optionally in the presence of a curing agent or catalyst, facilitates a chemical bond 413 between graphene sheet fill particle 460 and polymer chain 430. In the example of FIG. 4, reactive group 411 is reactive with respect to any one of carboxyl functional groups 304, 306, 321. Furthermore, in the illustrated example, reactive group 411 reacts with carboxyl functional group 306 to form chemical bond 413 having a covalent bond via an ester 412 derived from.

In the context of FIG. 4, polymer chain 430 may be any polymer chain having a reactive group 411 that is reactive with a carboxyl functional group 306. In some embodiments, polymer chain 430 is a polydimethylsiloxane chain, an epoxy chain, or a polyurethane chain. In an embodiment, polymer chain 430 is polyurethane with a nitrogen based reactive group 411 that reacts with carboxyl functional group 306 to form chemical bond 413 such that ester 412 is covalently bonded to a nitrogen atom (not shown) of reactive group 411. Such material systems may be advantageous as providing high thermal conductivity and the advantage of being impervious to the flux needed in solder TIM (STIM) processing. In some embodiments, composite TIM 102 including polyurethane may be applied directly adjacent to a STIM.

In some embodiments, the resultant composite TIM includes a bulk polyurethane with graphene sheet fill particles having carboxyl functional group(s) (unreacted) such that a polyurethane chain is covalently bonded to a graphene sheet particle via an ester (from a reacted functional group). In some embodiments, the graphene sheet fill particles are 20% to 30% of the composite TIM by volume. In some embodiments, the resultant composite TIM includes a bulk polyurethane with carbon nanotube fill particles having carboxyl functional group(s) (unreacted) such that a polyurethane chain is covalently bonded to a carbon nanotube fill particle via an ester (from a reacted functional group).

In FIG. 4, only a single polymer chain 430 is shown reacting with a single carboxyl functional group 306 to form a single chemical bond 413 between graphene sheet fill particle 460 and polymer chain 430. In other examples, multiple reactive groups of multiple polymer chains react with multiple carboxyl functional groups of the same graphene fill particle (or carbon nanotube fill particle). For example, some or all carboxyl functional groups of functionalized graphene sheet fill particle 310 (or functionalized carbon nanotube fill particle 320) may react to form chemical bonds in analogy to chemical bond 413.

Figure 5:
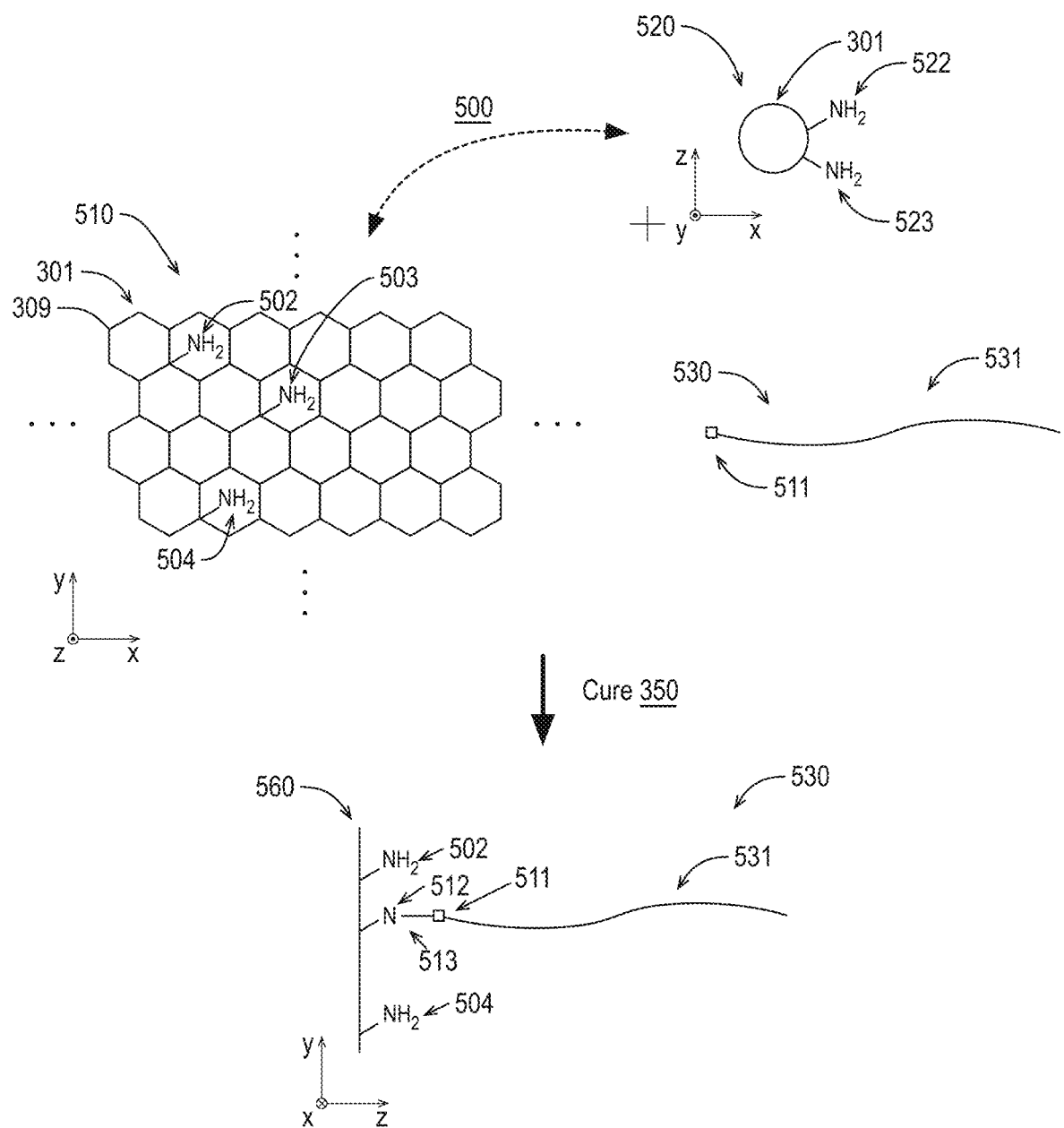
FIG. 5 illustrates a depiction of forming an exemplary chemical bond between an example carbon lattice based fill particle and an example polymer chain via an amine functional group.

FIG. 5 illustrates a depiction of forming an exemplary chemical bond between an example carbon lattice based fill particle and an example polymer chain via an amine functional group, in accordance with some embodiments. For example, a functionalized graphene sheet fill particle 510 or a functionalized carbon nanotube fill particle 520 may react with a polymer chain 530 to form a covalent bond therebetween. As above, in FIG. 5, functionalized graphene sheet fill particle 510 is shown reacting with polymer chain 530; however, either functionalized graphene sheet fill particle 310 or functionalized carbon nanotube fill particle 320 (as shown via replacement 500) or both may be reacted with polymer chain 530 to form a covalent bond therebetween.

Functionalized graphene sheet fill particle 510 and functionalized carbon nanotube fill particle 520 include hexagonal lattice of carbon atoms 301 as discussed herein. Furthermore, functionalized graphene sheet fill particle 510, includes any number of functional groups 502-504 including an amine functional group 502 (i.e., —$NH_2$ an amine functional group 503, and an amine functional group 504. For example, functionalized graphene sheet fill particle 510 may be characterized as a graphene nitride sheet. Similarly, functionalized carbon nanotube fill particle 520 includes any number of amine functional groups such as an amine functional group 521 and an amine functional group 522. In some embodiments, functionalized graphene sheet fill particle 510 and/or functionalized carbon nanotube fill particle 520 include about 2% nitrogen by weight. In some embodiments, functionalized graphene sheet fill particle 510 and/or functionalized carbon nanotube fill particle 520 include not less than 1% nitrogen by weight. In some embodiments, functionalized graphene sheet fill particle 510 and/or functionalized carbon nanotube fill particle 520 include not less than 2% nitrogen by weight.

Polymer chain 530 includes a reactive group 511 and a tail 531. Polymer chain 530 includes one or more reactive groups (e.g., one on each end and/or branches with additional reactive groups). Reactive group 511 may be any suitable molecule portion that reacts in a predictable manner with respect to an amine functional group of functionalized graphene sheet fill particle 510 and functionalized carbon nanotube fill particle 520. Tail 531 may be a relatively long polymer chain comprising repeating non reactive molecular groups and polymer chain 530 may be any suitable size as discussed with respect to polymer chain 330.

During cure 350, reactive group 511 reacts with one of amine functional groups 502-504, 522, 523 based on the chemistry between reactive group 511 and amine functional groups 502-504, 522, 523. As shown with respect to functionalized graphene sheet fill particle 510, cure 350 is applied, optionally in the presence of a curing agent or catalyst, to provide chemical bond 513 between graphene sheet fill particle 560 and polymer chain 530. In addition or in the alternative, cure 350 may be applied to analogously chemical bond between a carbon nanotube and polymer chain 530.

Reactive group 511 is reactive with any one of amine functional groups 502-504, 522, 523 and is depicted as reacting with amine functional group 503 to form chemical bond 513 having a covalent bond via a nitrogen atom 512 (N) of amine functional group 503. In FIG. 5, polymer chain 530 may be any polymer chain having a reactive group 511 that is reactive with an amine functional group. In some embodiments, polymer chain 530 is a polydimethylsiloxane chain, an epoxy chain, or a polyurethane chain. In an embodiment, polymer chain 530 is polyurethane with an oxygen based reactive group 511 that reacts with amine functional group 503 to form chemical bond 513 such that nitrogen atom 512 is covalently bonded to an oxygen atom (not shown) of reactive group 511. As with those of FIG. 4, such material systems may be advantageous as providing high thermal conductivity and the advantage of being impervious to the flux needed in solder TIM (STIM) processing.

In some embodiments, the resultant composite TIM includes a bulk polyurethane with graphene sheet fill particles having amine functional group(s) (unreacted) such that a polyurethane chain is covalently bonded to a graphene sheet particle via a nitrogen atom (from a reacted functional group). In some embodiments, the graphene sheet fill particles are 20% to 30% of the composite TIM by volume. In some embodiments, the resultant composite TIM includes a bulk polyurethane with carbon nanotube fill particles having amine functional group(s) (unreacted) such that a polyurethane chain is covalently bonded to a carbon nanotube fill particle via a nitrogen atom (from a reacted functional group).

In FIG. 5, only a single polymer chain 530 is shown reacting with a single amine functional group 504 to form a single chemical bond 513 between graphene sheet fill particle 560 and polymer chain 530. In other examples, multiple reactive groups of multiple polymer chains react with multiple amine functional groups of the same graphene fill particle (or carbon nanotube fill particle). For example, some or all amine functional groups of functionalized graphene sheet fill particle 510 (or functionalized carbon nanotube fill particle 520) may react to form chemical bonds in analogy to chemical bond 513.

With reference to FIG. 2, a resin containing any number of polymer chains such as polymer chains 330, 430, 530 may be mixed with functionalized carbon lattice based fill particles such as functionalized graphene fill particles 310, 510 and/or functionalized carbon nanotube fill particles 320, 520. The composite may then be cured to form composite TIM 102 having any number of covalent bonds between the carbon lattice based fill particles and the polymer chains.

As discussed, in some embodiments, multiple types of the carbon lattice based fill particles and/or polymer chains may be implemented in composite TIM 102.

Figure 6:
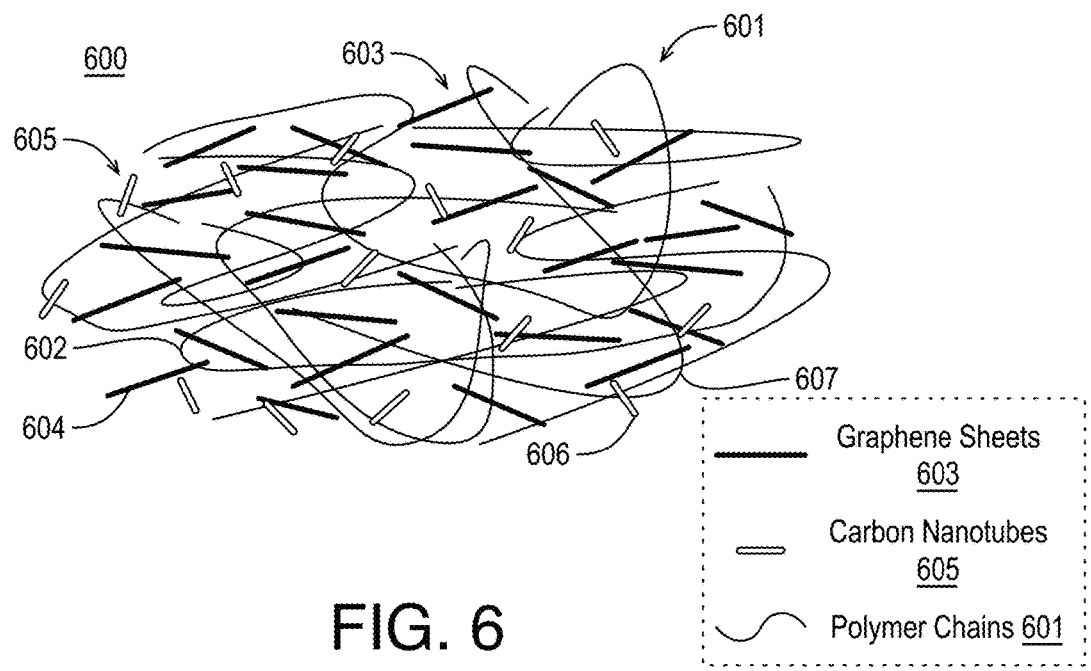
FIG. 6 illustrates a depiction of an exemplary composite thermal interface material including multiple carbon lattice based fill particle types.

FIG. 6 illustrates a depiction of an exemplary composite thermal interface material 600 including multiple carbon lattice based fill particle types, in accordance with some embodiments. As shown in FIG. 6, composite TIM 600 may include both graphene sheet fill particles 603 chemically bonded to polymer chains 601 and carbon nanotube fill particles 605 chemically bonded to polymer chains 601. Polymer chains 601 are also chemically bonded to one another and cross-linked throughout composite TIM 600. It is noted that composite TIM 600 of FIG. 6 includes a single polymer chain type. In other embodiments, composite TIM 600 may include multiple polymer chain types.

Graphene sheet fill particles 603 may include any characteristics discussed herein including carbon lattices, functional groups, covalent bonds, and so on such as those discussed with respect to graphene fill particles 310, 510 and/or carbon lattice based fill particles 203. Carbon nanotube fill particles 605 may also include any characteristics discussed herein including carbon lattices, functional groups, covalent bonds, and so on such as those discussed with respect to carbon nanotube fill particles 320, 520 and/or carbon lattice based fill particles 203. Similarly, polymer chains 601 may include any characteristics discussed herein including tails, sizes, reactive groups, and so on such as those discussed with respect to polymer chains 330, 430, 530 and/or polymer chains 201.

In some embodiments, graphene sheet fill particles 603 and carbon nanotube fill particles 605 include, prior to cure and potentially after, hydroxyl functional groups, some of which are chemically bonded to reactive groups of polymer chains 601 to form covalent bonds via oxygen atoms of the hydroxyl functional groups. In some embodiments, the polymer chains are polydimethylsiloxane chains having silicon based reactive groups that react with the hydroxyl functional groups as discussed. In some embodiments, graphene sheet fill particles 603 and carbon nanotube fill particles 605 include, prior to cure and potentially after, carboxyl functional groups, some of which are chemically bonded to reactive groups of polymer chains 601 to form covalent bonds via esters of the carboxyl functional groups. In some embodiments, the polymer chains are polyurethane chains having nitrogen based reactive groups that react with the carboxyl functional groups as discussed. In some embodiments, graphene sheet fill particles 603 and carbon nanotube fill particles 605 include, prior to cure and potentially after, amine functional groups, some of which are chemically bonded to reactive groups of polymer chains 601 to form covalent bonds via nitrogen of the amine functional groups. In some embodiments, the polymer chains are polyurethane chains having oxygen based reactive groups that react with the amine functional groups as discussed.

For example, as shown, composite TIM 600 includes a graphene sheet fill particle 604 chemically bonded to a polymer chain 602 and a carbon nanotube fill particle 606 chemically bonded to a polymer chain 607. Notably, the concentration of the components of composite TIM 600, polymer chains 601, graphene sheet fill particles 603, and carbon nanotube fill particles 605, may be varied to provide different properties of composite TIM 600. In an embodiment, composite TIM 600 includes 20% to 30% graphene sheet fill particles 603 by volume, 1% to 10% carbon nanotube fill particles 605 by volume, and the balance polymer chains 601. In some embodiments, composite TIM 600 includes not less than 20% graphene sheet fill particles 603 by volume and not less than 1% carbon nanotube fill particles 605 by volume. In some embodiments, composite TIM 600 includes not less than 20% graphene sheet fill particles 603 by volume and not less than 5% carbon nanotube fill particles 605 by volume.

Such concentrations may provide enhanced thermal conductivity and other properties discussed herein as well as improved lateral dissipation of heat. Furthermore, as discussed with respect to FIG. 11D, graphene sheet fill particles 603 and carbon nanotubes 605 may respond differently to compression during cure to provide differing characteristics in the composite TIM to provide further lateral heat dissipation.

Discussion now turns to assemblies and systems that incorporate composite TIM materials. In the following, any composite TIM discussed herein may be employed in any composite TIM implementation. For example, any of composite TIM 102, composite TIM 600, or a compressed composite TIM as discussed with respect to FIG. 11D may be employed.

Figure 7:
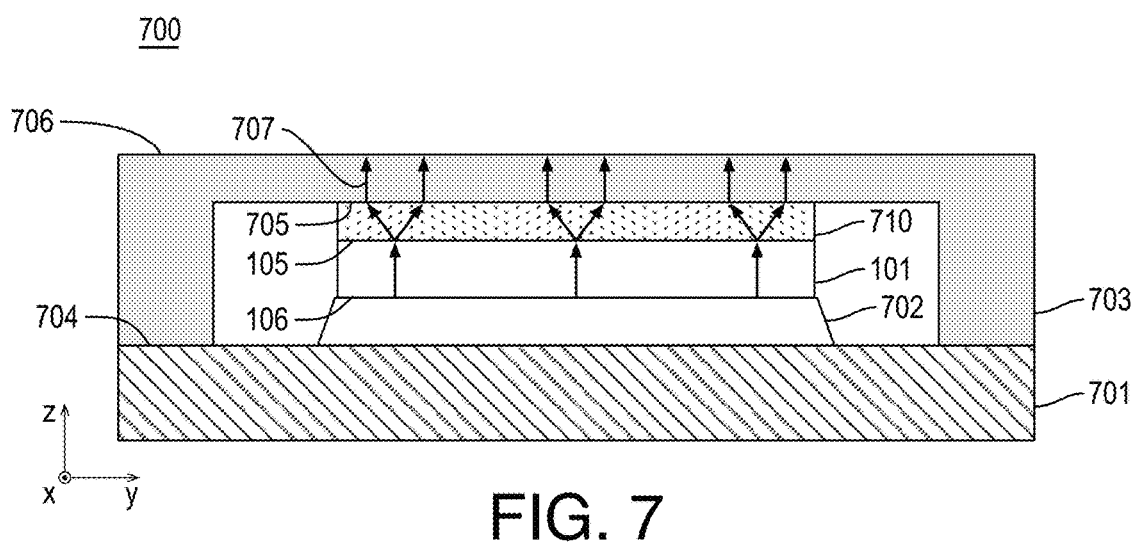
FIG. 7 illustrates a cross sectional view of a microelectronic die incorporated into a system.

FIG. 7 illustrates a cross sectional view of microelectronic die 101 incorporated into a system 700, in accordance with some embodiments. System 700 may also be characterized as a die assembly, a package assembly, or the like. As shown in FIG. 7, system 700 includes microelectronic die 101 over a substrate 701, a composite TIM 710 over microelectronic die 101, and an integrated heat spreader 703 over composite TIM 710 and over substrate 701.

Substrate 701 may be any suitable substrate such as an assembly substrate, a package substrate, a motherboard substrate, an interposer substrate, or the like. In some embodiments, substrate 700 is attached to a host circuit board (not shown). Although only one microelectronic die 101 is illustrated, two or more such dice may be similarly attached to substrate 710, for example in multi-chip package embodiments. Substrate 701 may be any suitable substrate to which microelectronic die 101 may be attached, either through first level interconnects (FLI), or through direct (e.g., hybrid) bonding, for example. Substrate 701 may therefore be another IC die, a passive or active interposer (glass or semiconductor), a package substrate, a mold material (with or without fan-out build-up metallization layers embedded therein), or the like. In the illustrated example, microelectronic die 101 is attached to substrate 700 via a capillary under fill 702, however, any die attach techniques may be used.

System 700 further includes a composite TIM 710 over microelectronic die 101. Composite TIM 710 may be any composite TIM discussed herein. In the illustrated embodiment, composite TIM 710 is on (i.e., physically coupled to) surface 105 of microelectronic die 101. In some embodiments, composite TIM 710 may further be on sides of microelectronic die 101. In some embodiments, another layer or material may be between composite TIM 710 and microelectronic die 101. In multi-chip package implementations, a second microelectronic die may be laterally adjacent to microelectronic die 101. In an embodiment, composite TIM 710 includes polyurethane (as discussed herein) and the adjacent microelectronic die is a solder TIM including flux. As discussed, composite TIM 710 including polyurethane may be advantageously impervious to the flux processing necessary for application of solder TIM.

As shown, integrated heat spreader 703 may be affixed to a surface 704 of substrate 701 along a perimeter of microelectronic die 101, for example, via an adhesive between integrated heat spreader 703 and substrate 701 and integrated heat spreader 703 has a surface 705 that is on (i.e., physically coupled to) composite TIM 710. Integrated heat spreader 703 is a lid or cap completely covering microelectronic die 101 and providing heat removal 707 to either the environment or a heat dissipation device (not shown). Integrated heat spreader 703 has a footprint larger than microelectronic die 101 for heat spreading and may include any composition offering high thermal conductivity. For example, integrated heat spreader 703 may include a copper, aluminum or stainless steel. System 700 provides heat removal from microelectronic die 101 for improved performance. Furthermore, system 700 may be incorporated into a die assembly including additional heat dissipation solutions.

Figure 8:
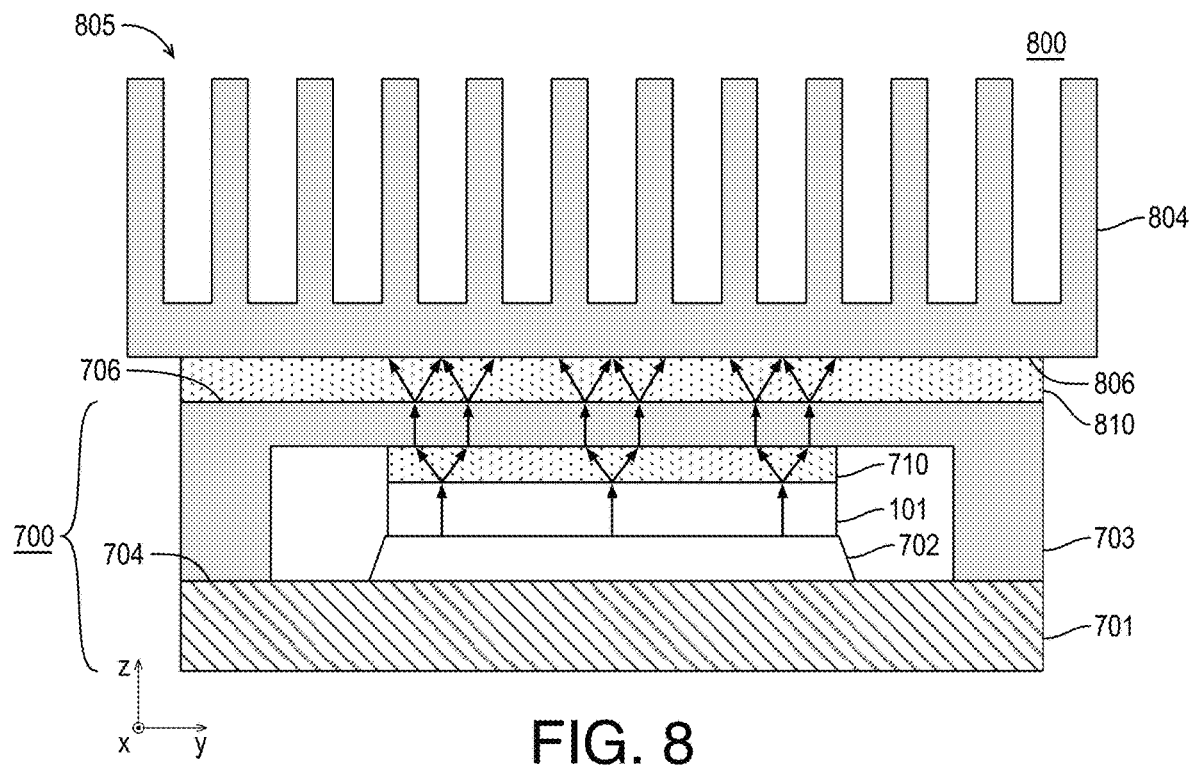
FIG. 8 illustrates a cross sectional view of a microelectronic die incorporated into a microelectronic die assembly.

FIG. 8 illustrates a cross sectional view of microelectronic die 101 incorporated into a microelectronic die assembly 800, in accordance with some embodiments. Microelectronic die assembly may be characterized as an IC die assembly, a package assembly, or the like. As shown in FIG. 8, microelectronic die assembly 800 includes system 700, a composite TIM 810 over integrated heat spreader 703 of system 700 and a heat sink 804 over composite TIM 810.

Composite TIM 810 may be any composite TIM discussed herein. In the context of FIG. 8, composite TIM 710 may be characterized as TIM 1 (or a first level TIM) and composite TIM 810 may be characterized as TIM 2 (or a second level TIM). In the illustrated embodiment, composite TIM 810 is on (i.e., physically coupled to) surface 706 of integrated heat spreader 703. In some embodiments, another layer or material may be between composite TIM 810 and integrated heat spreader 703. As shown, composite TIM 810 provides heat dissipation from integrated heat spreader 703 to heat sink 804. Heat sink 804 is on composite TIM 810 and heat sink includes tins 805 for the further dissipation of heat to an environment. Although illustrated with heat sink 804, any heat dissipation device may be disposed on composite TIM 810. For example, any one of a cold plate, a heat pipe, may be implemented as a heat dissipation device on composite TIM 810.

In FIG. 8, both TIM 1 and TIM 2 are composite TIMS composite TIM 710 and composite TIM 810). In other embodiments, one of TIM 1 or TIM 2 may be alternative TIM such as a STIM or a PTIM exclusive of a carbon based fill or having an unbonded carbon based fill. For example, other TIM solutions may offer characteristics such as adhesion, flexibility, ease of application, etc. that warrant their use in some contexts. Furthermore, in some embodiments, both TIM 1 and TIM 2 are composite TIMS (i.e., composite TIM 710 and composite TIM 810) that use the same material components. In other embodiments, they may use different material components or the same components at different concentrations. In one advantageous embodiment, TIM 1 is a polyurethane based material using graphene sheets and/or carbon nanotubes while TIM 2 is a polydimethylsiloxane based material using graphene sheets and/or carbon nanotubes.

Figure 9:
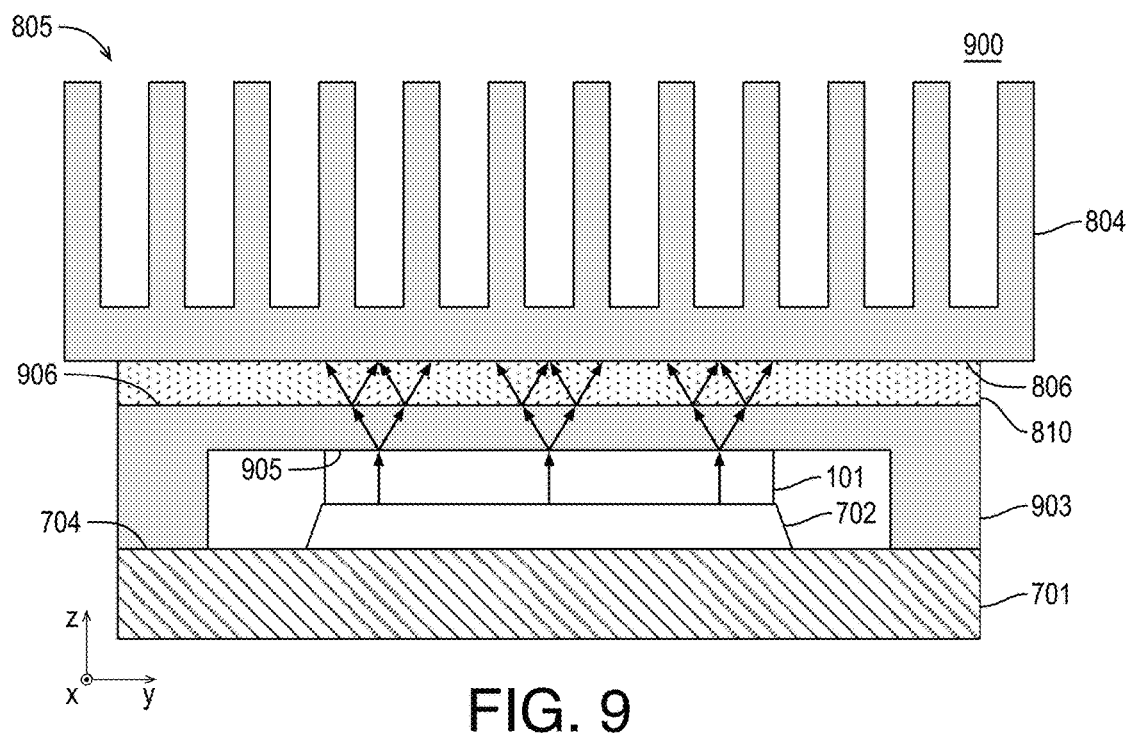
FIG. 9 illustrates a cross sectional view of microelectronic die incorporated into another microelectronic die assembly.

FIG. 9 illustrates a cross sectional view of microelectronic die 101 incorporated into another microelectronic die assembly 900, in accordance with some embodiments. Microelectronic die assembly may be characterized as an IC die assembly, a package assembly, or the like. As shown in FIG. 9, microelectronic die assembly 900 includes microelectronic die 101 over substrate 701, an integrated heat spreader 903 on microelectronic die 101 and substrate 701, composite TIM 810 over integrated heat spreader 903, and heat sink 804 over composite TIM 810.

As shown, microelectronic die assembly 900 excludes a composite TIM between microelectronic die 101 and a surface 905 of integrated heat spreader 903. Instead, surface 905 of integrated heat spreader 903 is on microelectronic die 101 to dissipated heat therefrom. Integrated heat spreader 903 may be affixed to substrate 701 along a perimeter of microelectronic die 101 via an adhesive, for example. Furthermore, integrated heat spreader 903, as with integrated heat spreader 703, covers microelectronic die 101 and provides heat removal to heat sink 804 via composite TIM 810. In some embodiments, integrated heat spreader 903 include copper, aluminum or stainless steel.

Composite TIM 810 is on a surface 906 (opposite surface 905) of integrated heat spreader 903 to dissipate heat to heat spreader 804 over microelectronic die 101. Composite TIM 810 may be any composite TIM discussed herein. As shown, surface 806 of heat sink 804 (or another heat dissipation device such as a cold plate or heat pipe) is on composite TIM 810 to remove heat therefrom via fins 805 (or baffles).

Figure 10:
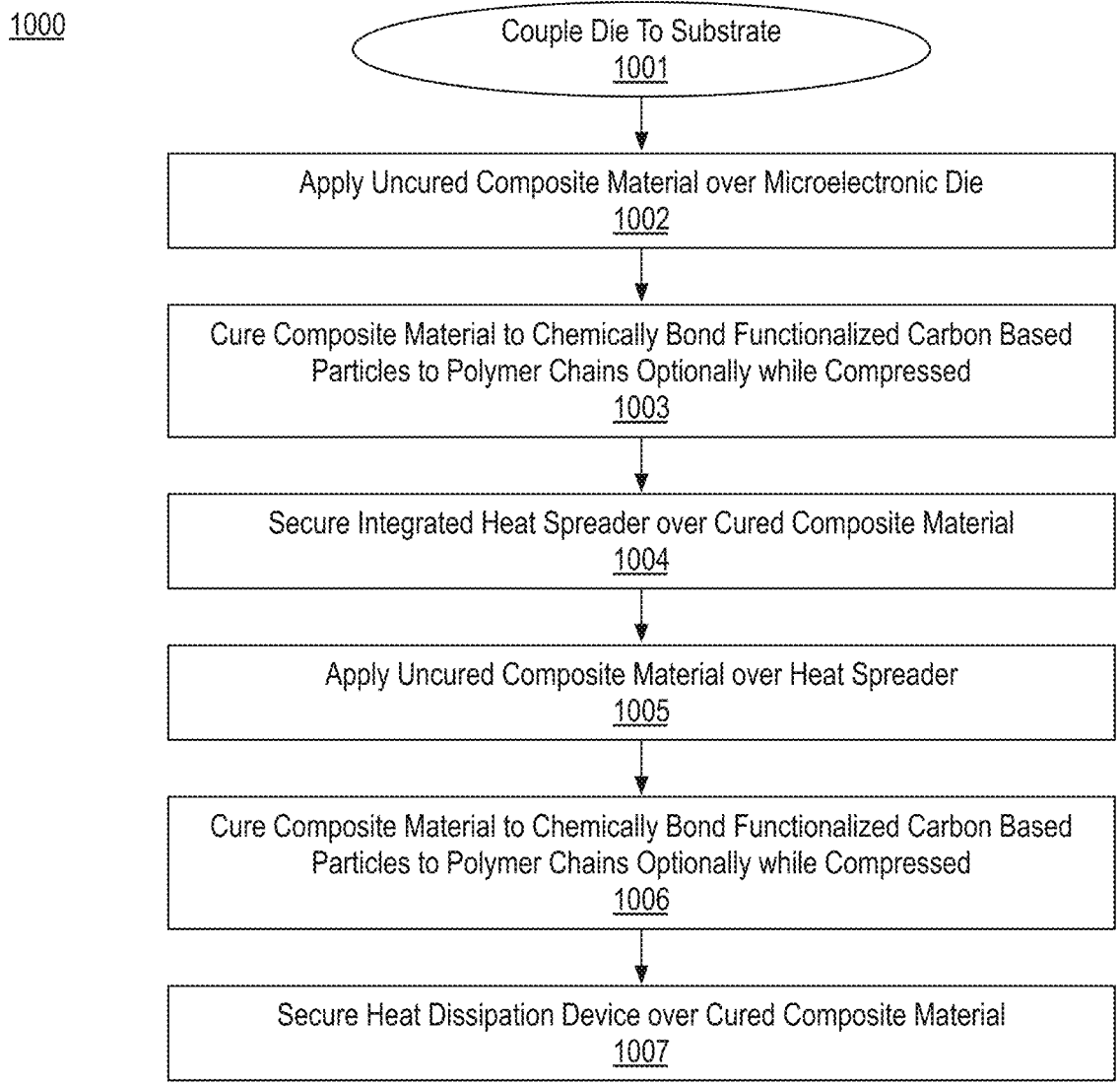
FIG. 10 illustrates a flow diagram of methods for forming a microelectronic device assembly including a composite TIM having fill particles with hexagonal lattices of carbon atoms.

FIG. 10 illustrates a flow diagram of methods 1000 for forming a microelectronic device assembly including a composite TIM having fill particles with hexagonal lattices of carbon atoms, in accordance with some embodiments. FIGS. 11A-11G illustrate microelectronic device assembly evolving as the methods of FIG. 10 are practiced, in accordance with some embodiments of methods 1000. For clarity of description, FIG. 10 is described in conjunction with FIGS. 11A-11G, which provide illustrative examples of some advantageous embodiments of methods 1000. However, not all embodiments of methods 1000 require all the features exemplified in FIGS. 11A-11G. Similarly, the practice of methods 1000 is not necessarily required to arrive at one or more of the features exemplified in FIGS. 11A-11G.

Referring first to FIG. 1 methods 1000 begin at operation 1001 where one or more microelectronic die are coupled (physically and/or electrically) to a substrate such as an assembly substrate. Operation 1001 may be performed as a first level of integrating a microelectronic die into an assembly that may be further integrated into an electronic system. Although not limited in this context, operation 1001 may be performed by a microelectronic die fabrication facility in preparation for the sale of a packaged microelectronic die product, for example. Alternatively, methods 1000 may begin with receiving, as an input, a microelectronic assembly that includes a microelectronic die coupled to a substrate. Hence, methods 1000 may include the first-level assembling, or first-level assembling may have been performed upstream of methods 1000.

Figure 11A:
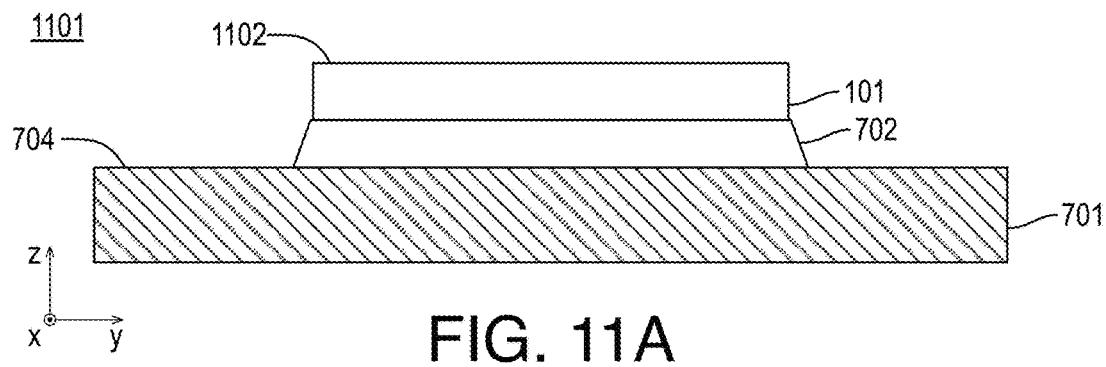
FIGS. 11A-11G illustrate a microelectronic device assembly evolving as the methods of FIG. 10 are practiced.

In the example further illustrated in the cross-sectional view of FIG. 11A, a microelectronic device assembly 1101 includes microelectronic die 101 attached to substrate 701 via a capillary under fill 702. Although only microelectronic die 101 is illustrated, two or more such IC die may be similarly attached to substrate 701, for example in multi-chip package embodiments. Microelectronic die 101 and any other die attached to substrate 701 may be any type of IC die discussed herein such as a microprocessor, a controller, an FPGA, an ASIC, a SOC, an electronic memory chip (e.g., DRAM, flash memory, etc.), a graphics processor, an AI accelerator, etc. Similarly, substrate 701 may be any suitable substrate discussed herein. In the illustrated example, microelectronic die 101 is attached to substrate 701 via capillary under fill 702, in addition or in the alterative, microelectronic die 101 may be attached to substrate 701 via first layer interconnects such as microbumps including solder joints or other connections. In the exemplary embodiment where microelectronic die 101 is flip-chip attached, surface 1102 is a back-side of microelectronic die 101. In some embodiments, surface 1102 is a bare semiconductor surface (e.g., monocrystalline silicon). In other embodiments, there is a back-side side metallization as surface 1102.

Returning to FIG. 10, methods 1000 continue at operation 1002, where an uncured composite material is applied over or on the die. In some embodiments, the uncured composite material is applied directly on the die. In other embodiments, an intervening layer may be applied on the die and the uncured composite material is applied on the intervening layer. The uncured composite material is a mixture of uncured polymer chains (a resin) and functionalized carbon lattice based fill particles (e.g., functionalized graphene or carbon nanotubes). The polymer chains and functionalized carbon lattice based fill particles may include any examples discussed herein at any concentration. The uncured composite material may be applied using any suitable technique or techniques such as application via a needle jet dispenser, a nozzle etc.

Figure 11B:
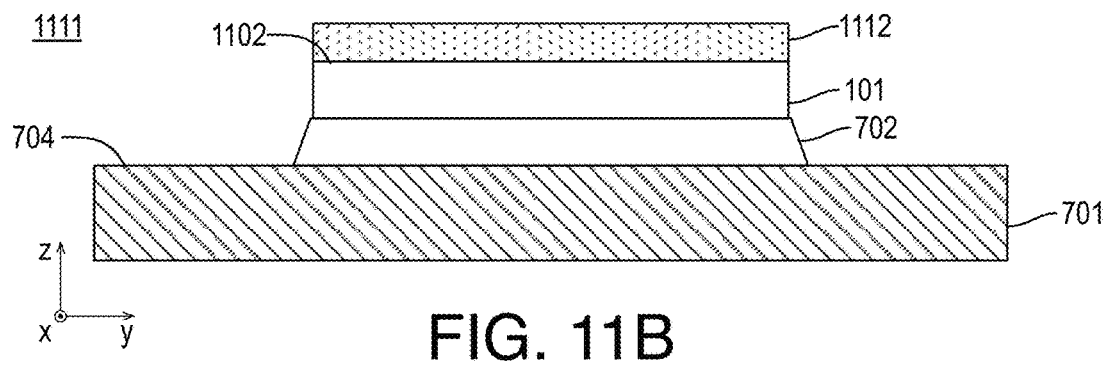

In the example further illustrated in the cross-sectional view of FIG. 11B, a microelectronic device assembly 1111 includes a composite TIM 1112 disposed on surface 1102 of microelectronic die 101. Composite TIM 1112 may include the characteristics of any composite TIM discussed herein (prior to cure). For example, composite TIM 1112 may include one or more polymer chains such as polydimethylsiloxane chains, epoxy polymer chains, or polyurethane polymer chains. Furthermore, composite TIM 1112 may include one or more of functionalized graphene or carbon nanotubes such that the functionalized graphene or carbon nanotubes are functionalized with one or more of hydroxyl functional groups, carboxyl functional groups, or amine functional groups. Composite TIM 1112 may also include a curing agent or catalyst. Such a curing agent or catalyst may catalyze the formation of chemical bonds between the reactive groups of the polymer chains and the functional groups of the functionalized graphene or carbon nanotubes and/or the formation of chemical bonds between the reactive groups of the polymer chains themselves.

Returning to FIG. 10, methods 1000 continue at operation 1003, where the uncured composite material applied at operation 1002 is cured to chemically bond the functionalized carbon based fill particles to polymer chains. The cure operation may include any suitable curing techniques such as applying heat via ambient heat in a processing chamber, applying UV light, or the like. Methods 1000 continue at operation 1004, where an integrated heat spreader is secured over the cured composite material. Any integrated heat spreader discussed herein may be implemented. As shown with respect to operation 1003, in some embodiments, compression (e.g., physical pressure) may also be applied during the cure. In some embodiments, the physical pressure or compression is applied via the integrated heat spreader secured at operation 1004. For example, an integrated heat spreader may secured to the uncured composite material such that a surface of the integrated heat spreader compresses the uncured composite material against the microelectronic die, and the cure may be performed by applying ambient heat during application of the compression.

Figure 11C:
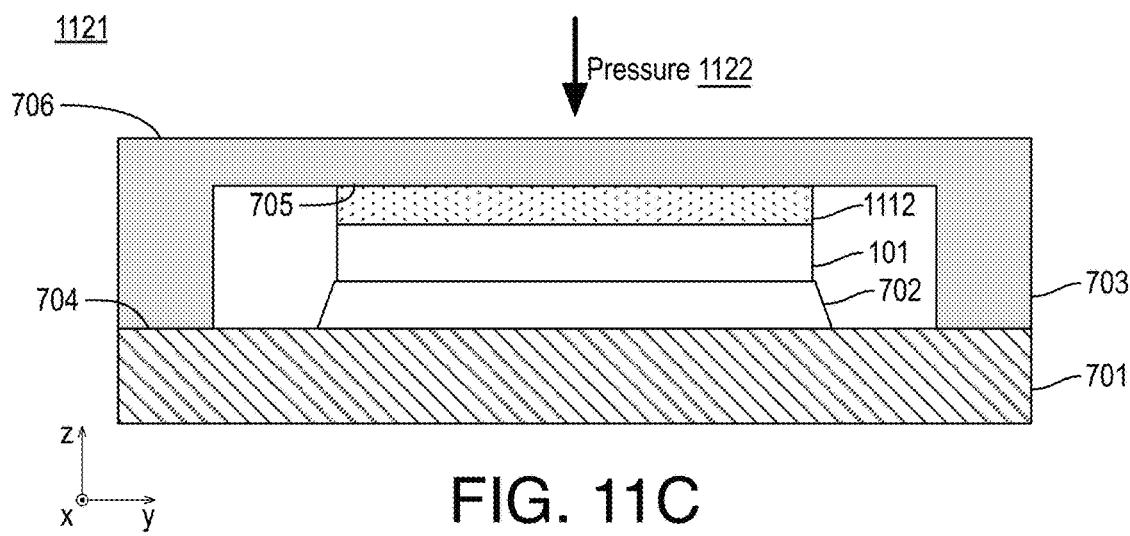

In the example further illustrated in the cross-sectional view of FIG. 11C, a microelectronic device assembly 1121 includes integrated heat spreader 703 having surface 705 providing compression via applied pressure 1122 to composite TIM 1112 during cure. Applied pressure 1122 may be implemented using any suitable technique or techniques such as a plate applying pressure to surface 706 while substrate 701 sits on a stationary chuck, a vice compressing surface 706 and an opposite surface of substrate 701, etc. In some embodiments, pressure 1122 is in the range of 4 to 12 pounds per square inch (PSI). In some embodiments, pressure 1122 is in the range of 8 to 12 pounds per square inch (PSI). In some embodiments, pressure 1122 is not less than 4 PSI. In some embodiments, pressure 1122 is not less than 8 PSI. The discussed cure and applied pressure processing may be performed with respect to any composite TIM material system discussed herein.

Figure 11D:
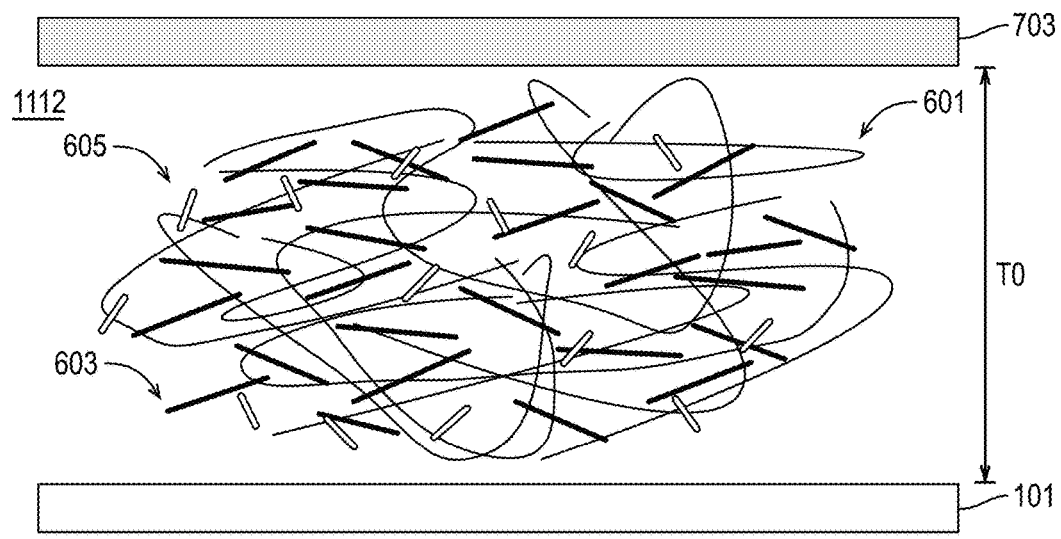
Figure 11D:
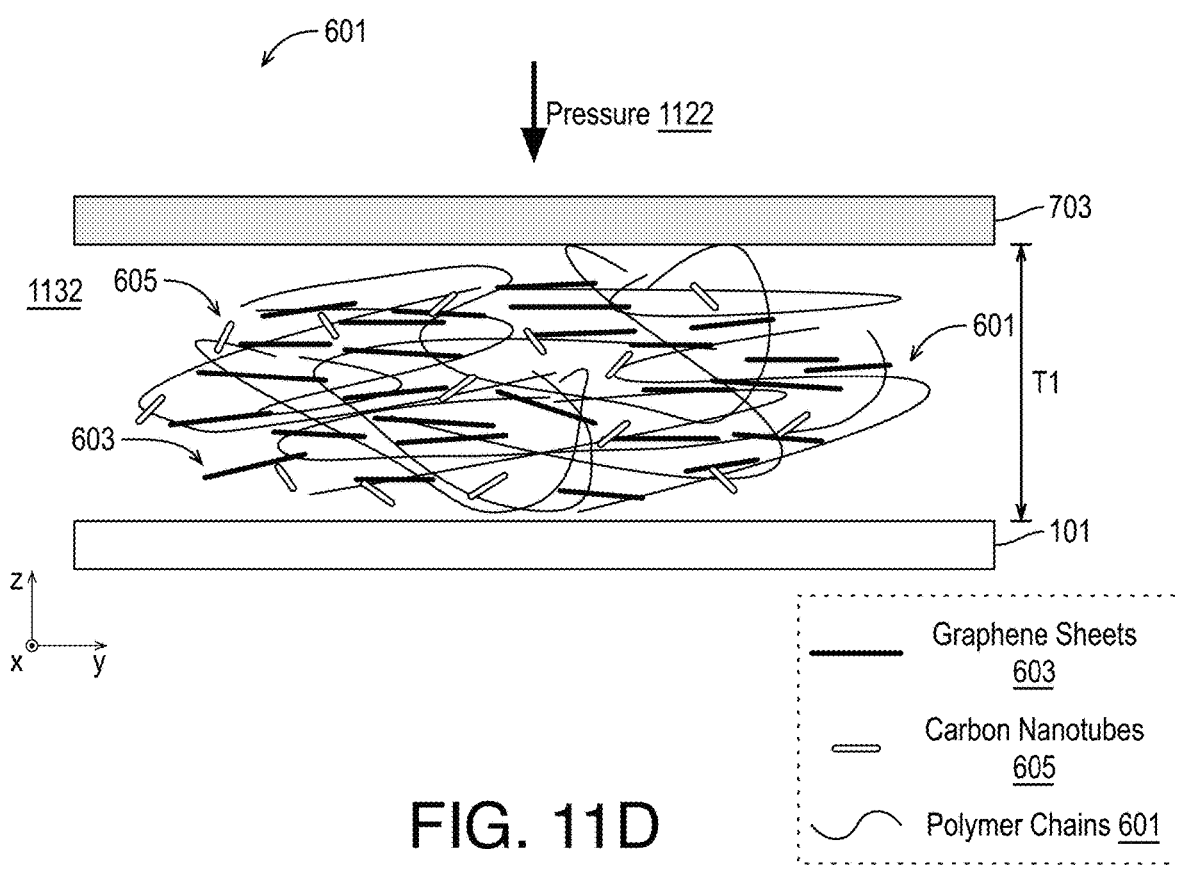
Figure 11E:
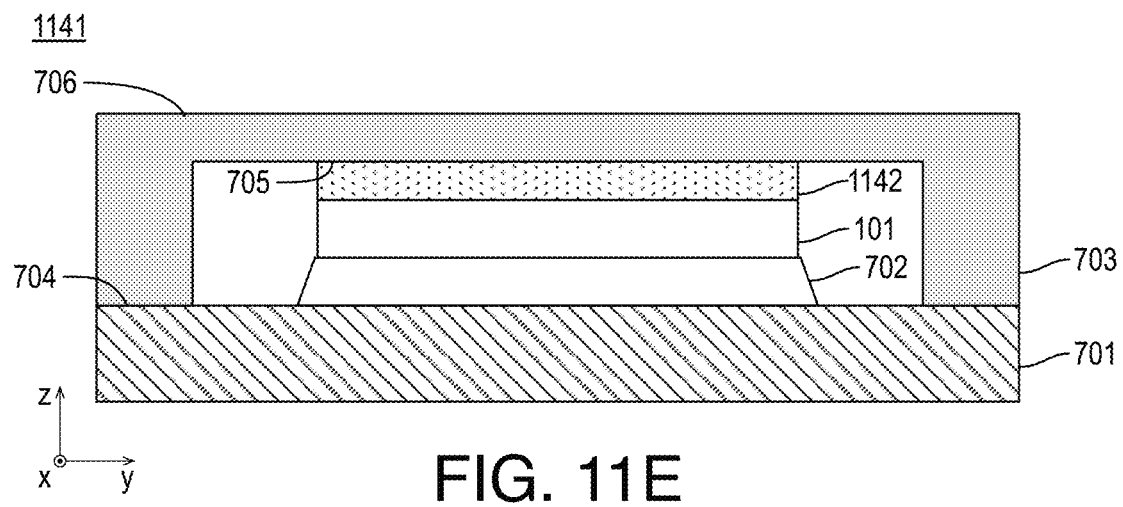

In the example further illustrated in the cross-sectional view of FIG. 11D, a portion of a microelectronic device assembly 1131 illustrates the effect of applied pressure 1122 during cure. As shown, pressure 1122 is applied to representative composite TIM 1112, which is illustrated as having a composition analogous to that of composite TIM 600 for the sake of clarity of presentation (although such pressure may be applied to any composite TIM discussed herein). As shown, by applying pressure 1122 to composite TIM 1112 during cure, cured composite TIM 1132 has a reduced thickness (e.g., z-height or z-dimension), T1, with respect to a thickness, T0, of composite TIM 1112 without applied pressure. Furthermore, due to application of pressure 1122, within cured composite TIM 1132, graphene sheets 603 have become substantially more horizontally aligned (i.e., in the x-y plane) with respect to carbon nanotubes 605, which have become horizontally aligned to a lesser degree, or not at all. Thereby, graphene sheets 603 as influenced by pressure 1122 applied during cure may enhance lateral heat dissipation (i.e., in the x-y plane). Furthermore, by providing a balance of graphene sheets 603 and carbon nanotubes 605, lateral and vertical (i.e. in the z-direction) heat dissipation may be balanced. For example, 20% to 30% graphene sheet fill particles by volume and 1% to 10% carbon nanotube fill particles 605 by volume may balance such lateral and vertical heat dissipation. In some embodiments, as discussed with respect to composite TIM 600, composite TIM 1132 includes not less than 20% graphene sheet fill particles 603 by volume and not less than 1% carbon nanotube fill particles 605 by volume. In some embodiments, composite TIM 1132 includes not less than 20% graphene sheet fill particles 603 by volume and not less than 5% carbon nanotube fill particles 605 by volume. Composite TIM 1132 may be used in place of any other composite TIM discussed herein (e.g., composite TIM 102, 200, 710, 810).

In some embodiments, graphene sheet fill particles 603 of composite TIM 1132 have an alignment from vertical measured as average of angles between the z-direction of FIG. 11D a vector of a graphene sheet extending along a sheet orientation the graphene (e.g., a vector in the x-y plane of FIG. 3). Similarly, carbon nanotube fill particles 605 of composite TIM 1132 have an alignment from vertical measured as an average angle between the z-direction and a vector extending along the tube direction of graphene sheet fill particles (e.g., a vector along the y axis in FIG. 3). In some embodiments, the alignment from vertical measurement for graphene sheet fill particles 603 (as based on a sampling thereof) is substantially larger than that of carbon nanotube fill particles 605 (as based on a sampling thereof) since graphene sheet fill particles 603 are more laterally aligned. In some embodiments, the alignment from vertical angle for graphene sheet fill particles 603 is not less than twice that of carbon nanotube fill particles 605.

With reference to FIG. 10, as discussed, in some embodiments, the cure of operation 1003 is performed without applied pressure and the integrated heat spreader is secured over the cured composite TIM. In the example further illustrated in the cross-sectional view of FIG. 11E, a microelectronic device assembly 1141 illustrates a secured integrated heat spreader over a composite TIM 1142, which is representative of any composite TIM discussed herein. As illustrated with respect to FIG. 9, in some embodiments, no TIM 1 is applied. In yet other embodiments, TIM 1 may be exclusive of composite TIM materials discussed herein and instead a STIM or other PTIM may be applied.

Methods 1000 continue at operation 1005, where an uncured composite material is applied over or on the integrated heat spreader. In some embodiments, the uncured composite material is applied directly on the integrated heat spreader. In other embodiments, an intervening layer may be applied on the integrated heat spreader and the uncured composite material is applied on the intervening layer. The uncured composite material is a mixture of uncured polymer chains (a resin) and functionalized carbon lattice based fill particles (e.g., functionalized graphene or carbon nanotubes). The polymer chains and functionalized carbon lattice based fill particles may include any examples discussed herein at any concentration. As with operation 1002, the uncured composite material may be applied using any suitable technique or techniques such as application via a needle jet dispenser, a nozzle etc.

Figure 11F:
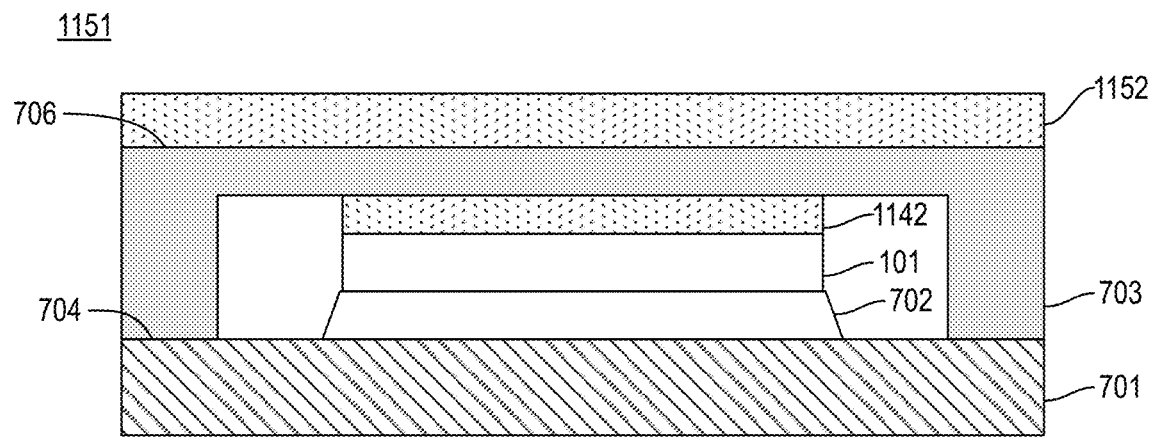

In the example further illustrated in the cross-sectional view of FIG. 11F, a microelectronic device assembly 1151 includes a composite TIM 1152 disposed on surface 706 of integrated heat spreader 703. Composite TIM 1152 may include the characteristics of any composite TIM discussed herein (prior to cure). For example, composite TIM 1152 may include one or more polymer chains such as polydimethylsiloxane chains, epoxy polymer chains, or polyurethane polymer chains. Furthermore, composite TIM 1152 may include one or more of functionalized graphene or carbon nanotubes such that the functionalized graphene or carbon nanotubes are functionalized with one or more of hydroxyl functional groups, carboxyl functional groups, or amine functional groups. Composite TIM 1152 may also include a curing agent or catalyst to catalyze the formation of chemical bonds between the reactive groups of the polymer chains and the functional groups of the functionalized graphene or carbon nanotubes and/or the formation of chemical bonds between the reactive groups of the polymer chains themselves.

Returning to FIG. 10, methods 1000 continue at operation 1006, where the uncured composite material applied at operation 1005 is cured to chemically bond the functionalized carbon based fill particles to polymer chains. The cure operation may include any suitable curing techniques such as applying heat via ambient heat in a processing chamber, applying UV light, or the like. Methods 1000 continue at operation 1007, where heat dissipation device is secured over the cured composite material. Any heat dissipation device discussed herein may be implemented including a heat sink, a cold plate, or a heat pump. As shown with respect to operation 1006, in some embodiments, compression (e.g., physical pressure) may also be applied during the cure. In some embodiments, the physical pressure or compression is applied via the heat dissipation device secured at operation 1007. For example, a heat dissipation device may secured to the uncured composite material such that a surface of the heat dissipation device compresses the uncured composite material against the integrated heat spreader, and the cure may be performed by applying ambient heat during application of the compression.

Figure 11G:
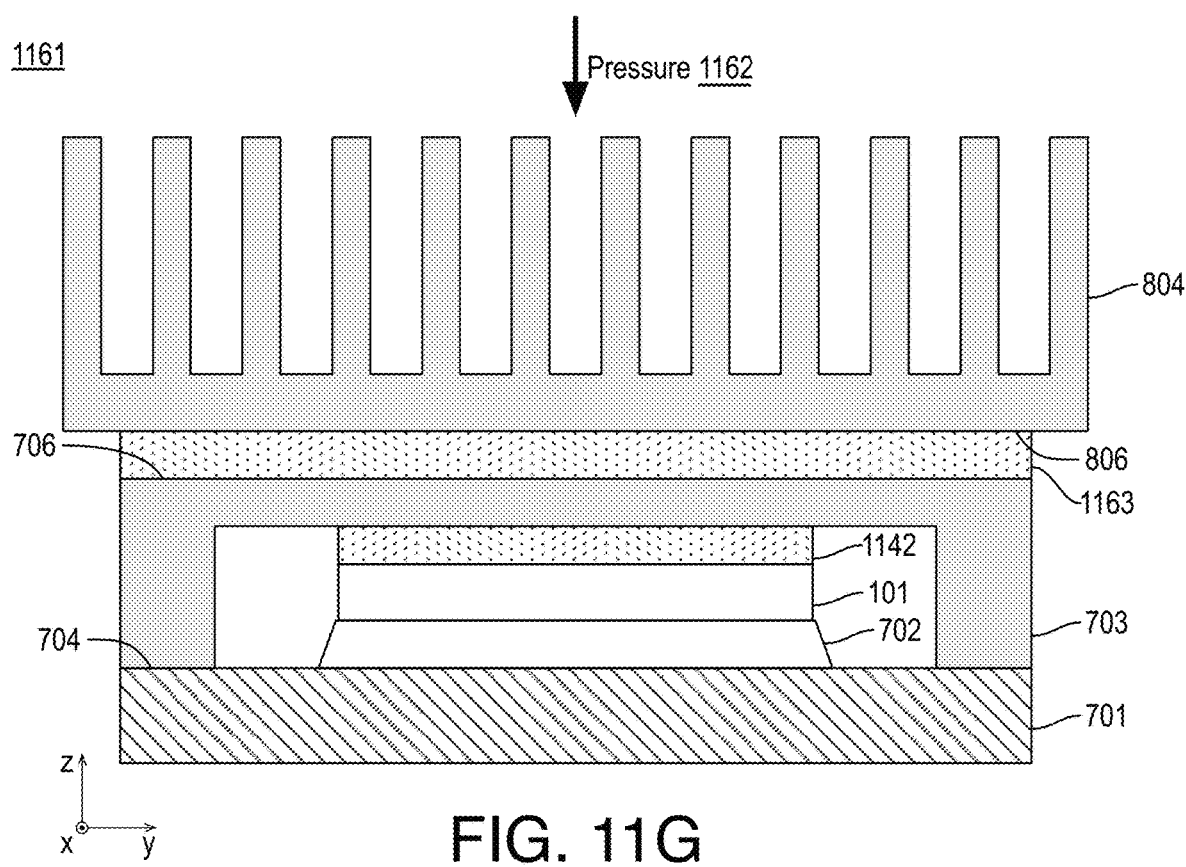

In the example further illustrated in the cross-sectional view of FIG. 11G, a microelectronic device assembly 1161 includes heat sink 804 (e.g., an exemplary heat dissipation device) having surface 805 providing compression via applied pressure 1162 to a composite TIM during cure to generate composite TIM 1163. Applied pressure 1162 may be implemented using any suitable technique or techniques such as a plate applying pressure to heat sink 804 while substrate 701 sits on a stationary chuck, a vice compressing heat sink 804 and an opposite surface of substrate 701, etc. In some embodiments, pressure 1162 is in the range of 4 to 12 pounds per square inch (PSI). In some embodiments, pressure 1162 is in the range of 8 to 12 pounds per square inch (PSI). In some embodiments, pressure 1162 is not less than 4 PSI. In some embodiments, pressure 1162 is not less than 8 PSI. The discussed cure and applied pressure processing may be performed with respect to any composite TIM material system discussed herein. The effects of such cure during application of pressure may be analogous to those discussed with respect to FIG. 11D.

With reference to FIG. 10, as discussed, in some embodiments, the cure of operation 1006 is performed without applied pressure and the heat dissipation device is secured over the cured composite TIM. For example, with reference to FIG. 11G, composite TIM 1163 may be generated without use of pressure 1162 (and in the absence of heat sink 804), and heat sink 804 may be subsequently secured to composite TIM 1163 (via attachment to a bolster plate or the like).

Thereby, a system or die assembly as discussed with respect to any of FIGS. 7-9 may be generated using methods 1000. The materials, systems, and methods discussed herein provide composite TIMs for improved thermal performance. Such composite TIM systems may employ any suitable resin system such as PDMS, epoxy, and polyurethane and hexagonal lattice carbon based fill particles such as hydroxyl functionalized graphene, hydroxyl functionalized multiwall carbon nanotubes, and reduced graphene oxide, which may be cured to form polymer chains covalently bonded to the fill particles having hexagonal lattices of carbon atoms. In polyurethane based TIM systems, the resultant composite TIM provides a flux resistant material that may be used directly adjacent to STIM.

Figure 12:
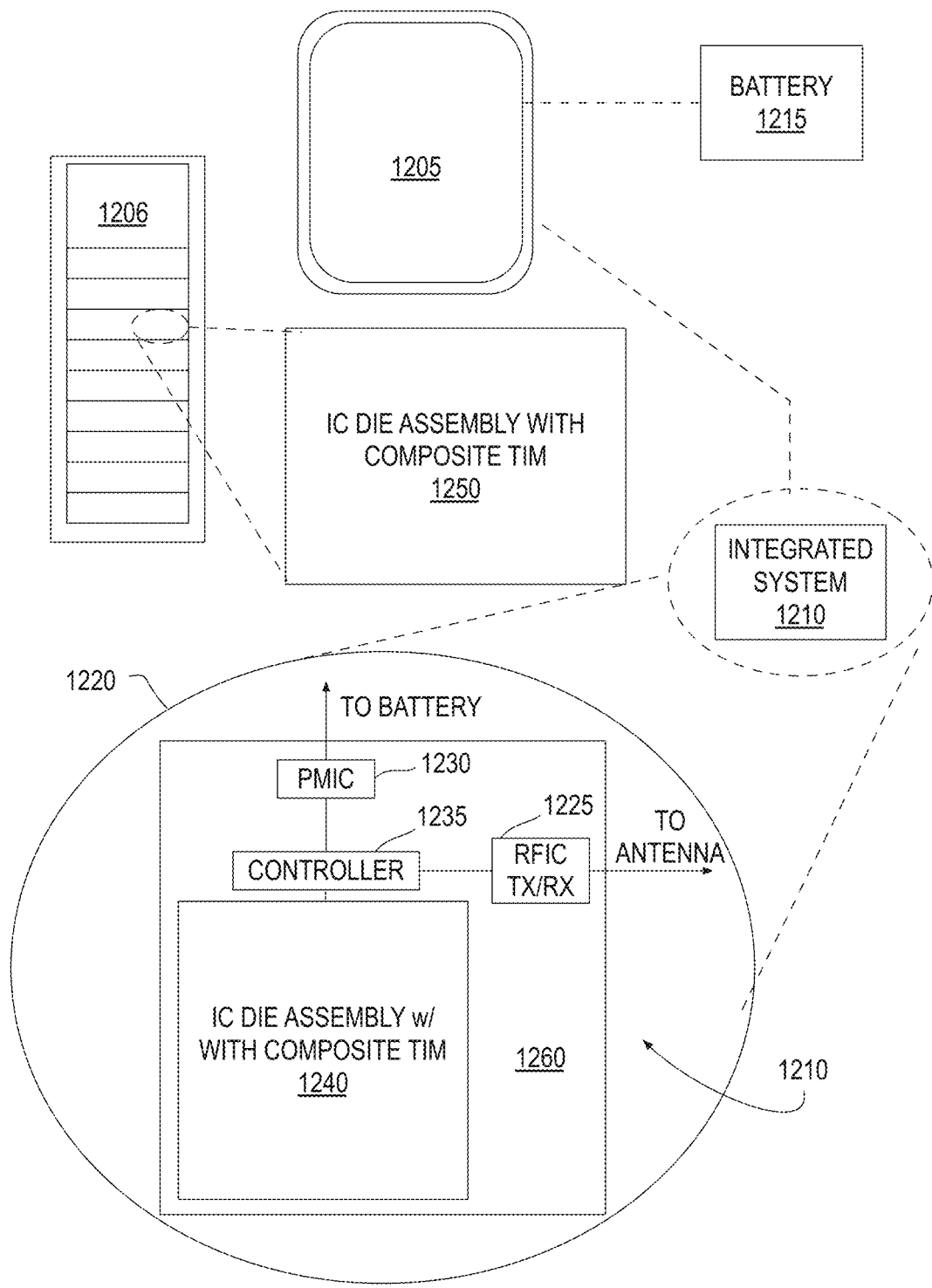
FIG. 12 illustrates a system employing an IC assembly including a thermal interface material frame suitable for containing thermal interface materials.

FIG. 12 illustrates some exemplary systems employing an IC assembly including a composite thermal interface material having a polymer chain chemically bonded to a fill particle having a hexagonal lattice of carbon atoms, in accordance with some embodiments. The system may be a mobile computing platform 1205 and/or a data server machine 1206, for example. Either may employ a component assembly including at least one microelectronic or IC assembly that includes a composite thermal interface material having a polymer chain chemically bonded to a fill particle having a hexagonal lattice of carbon atoms, for example as described elsewhere herein. Server machine 1206 may be any commercial server, for example including any number of high-performance computing platforms disposed within a rack and networked together for electronic data processing, which in the exemplary embodiment includes an IC die assembly 1250 with a composite thermal interface material, for example as described elsewhere herein. Mobile computing platform 1205 may be any portable device configured for each of electronic data display, electronic data processing, wireless electronic data transmission, or the like. For example, mobile computing platform 1205 may be any of a tablet, a smart phone, a laptop computer, etc., and may include a display screen (e.g., a capacitive, inductive, resistive, or optical touchscreen), a chip-level or package-level integrated system 1210, and a battery 1215. Although illustrated with respect to mobile computing platform 1205, in other examples, chip-level or package-level integrated system 1210 and a battery 1215 may be implemented in a desktop computing platform, an automotive computing platform, an internet of things platform, or the like. As discussed below, in some examples, the disclosed systems may include a sub-system 1260 such as a system on a chip (SOC) or an integrated system of multiple ICs, which is illustrated with respect to mobile computing platform 1205.

Whether disposed within integrated system 1210 illustrated in expanded view 1220 or as a stand-alone packaged device within data server machine 1206, sub-system 1260 may include memory circuitry and/or processor circuitry 1240 (e.g., RAM, a microprocessor, a multi-core microprocessor, graphics processor, etc.), a power management integrated circuit (PMIC) 1230, a controller 1235, and a radio frequency integrated circuit (RFIC) 1225 (e.g., including a wideband RF transmitter and/or receiver (TX/RX)). As shown, one or more IC dice, such as memory circuitry and/or processor circuitry 1240 may be assembled and implemented such that one or more have an assembly including a composite thermal interface material having a polymer chain chemically bonded to a fill particle having a hexagonal lattice of carbon atoms. In some embodiments, RFIC 1225 includes a digital baseband and an analog front end module further comprising a power amplifier on a transmit path and a low noise amplifier on a receive path). Functionally, PMIC 1230 may perform battery power regulation, DC-to-DC conversion, etc., and so has an input coupled to battery 1215, and an output providing a current supply to other functional modules. As further illustrated in FIG. 12, in the exemplary embodiment, RFIC 1225 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Memory circuitry and/or processor circuitry 1240 may provide memory functionality for sub-system 1260, high level control, data processing and the like for sub-system 1260. In alternative implementations, each of the SOC modules may be integrated onto separate ICs coupled to a package substrate, interposer, or board.

Figure 13:
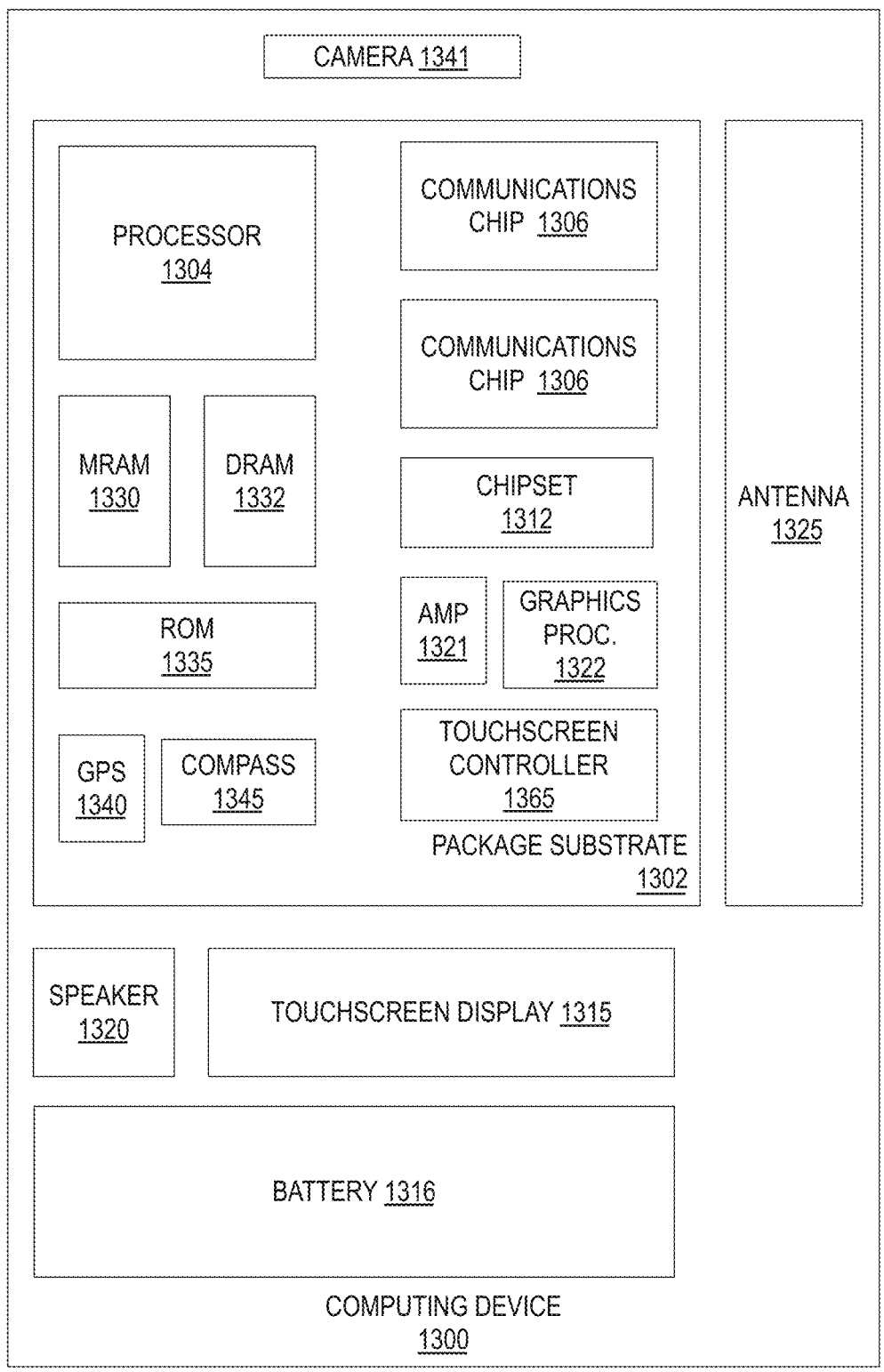
FIG. 13 is a functional block diagram illustrating an electronic computing device, all in accordance with some embodiments.

FIG. 13 is a functional block diagram of an electronic computing device 1300, in accordance with some embodiments. For example, device 1300 may, via any suitable component therein, employ a composite thermal interface material having a polymer chain chemically bonded to a fill particle having a hexagonal lattice of carbon atoms, for example as described elsewhere herein. Device 1300 further includes a motherboard or package substrate 1302 hosting a number of components, such as, but not limited to, a processor 1304 (e.g., an applications processor). Processor 1304 may be physically and/or electrically coupled to package substrate 1302. In some examples, processor 1304 is within an IC assembly that includes a composite thermal interface material, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1306 may also be physically and/or electrically coupled to the package substrate 1302. In further implementations, communication chips 1306 may be part of processor 1304. Depending on its applications, computing device 1300 may include other components that may or may not be physically and electrically coupled to package substrate 1302. These other components include, but are not limited to, volatile memory (e.g., DRAM 1332), non-volatile memory (e.g., ROM 1335), flash memory (e.g., NAND or NOR), magnetic memory (MRAM 1330), a graphics processor 1322, a digital signal processor, a crypto processor, a chipset 1312, an antenna 1325, touchscreen display 1315, touchscreen controller 1365, battery 1316, audio codec, video codec, power amplifier 1321, global positioning system (GPS) device 1340, compass 1345, accelerometer, gyroscope, speaker 1320, camera 1341, and mass storage device (such as hard disk drive, solid-state drive (SSD), compact disk (CD), digital versatile disk (DVD), and so forth, or the like.

Communication chips 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1306 may implement any of a number of wireless standards or protocols, including, but not limited to, those described elsewhere herein. As discussed, computing device 1300 may include a plurality of communication chips 1306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a microelectronic device comprises a microelectronic die and a composite material to conduct heat from the microelectronic die, the composite material comprising a polymer chain chemically bonded to a fill particle comprising a hexagonal lattice of carbon atoms.

In second examples, for any of the first examples, the fill particle comprises at least one of a hydroxyl functional group, a carboxyl functional group, or an amine functional group.

In third examples, for any of the first or second examples, the fill particle comprises a graphene sheet or a carbon nanotube.

In fourth examples, for any of the first through third examples, the polymer chain comprises a polydimethylsiloxane chain, an epoxy chain, or a polyurethane chain.

In fifth examples, for any of the first through fourth examples, the fill particle comprises a carboxyl functional group and the polymer chain comprises the polyurethane chain covalently bonded to the fill particle via an ester.

In sixth examples, for any of the first through fifth examples, the fill particle comprises an amine functional group and the polymer chain comprises the polyurethane chain covalently bonded to the fill particle via a nitrogen atom.

In seventh examples, for any of the first through sixth examples, the fill particle comprises a graphene sheet having a minimum cross sheet dimension of not less than 5 microns, the graphene sheet comprises a hydroxyl functional group, and the polymer chain comprises the polydimethylsiloxane chain covalently bonded to the graphene sheet via an oxygen atom.

In eighth examples, for any of the first through seventh examples, the composite material comprises fill particles in a bulk plurality of polymer chains, the fill particles each comprise a hexagonal carbon lattice, and the composite material comprises 20% to 30% of fill particles by volume.

In ninth examples, for any of the first through eighth examples, the fill particle comprises a graphene sheet, the polymer chain comprises a first polymer chain of the composite material, and the composite material further comprises a second polymer chain chemically bonded to a carbon nanotube.

In tenth examples, for any of the first through ninth examples, the composite material comprises graphene sheet fill particles and carbon nanotube fill particles in a bulk plurality of polymer chains, the composite material comprises 20% to 30% of graphene sheet fill particles by volume, and 1% to 10% of carbon nanotube fill particles by volume.

In eleventh examples, a system comprises a microelectronic die, a heat spreader having a first surface adjacent the microelectronic die and a second surface opposite the microelectronic die, and a composite material on one of the first surface or the second surface, the composite material comprising a polymer chain chemically bonded to a fill particle comprising a hexagonal lattice of carbon atoms.

In twelfth examples, for any of the eleventh examples, the composite material is between and in contact with both of the microelectronic die and the first surface of the heat spreader.

In thirteenth examples, for any of the eleventh or twelfth examples, the system further comprises a second composite material on the second surface of the heat spreader, the second composite material comprising a second polymer chain chemically bonded to a second fill particle comprising a second hexagonal lattice of carbon atoms.

In fourteenth examples, for any of the eleventh through thirteenth examples, the system further comprises a heat dissipation device having a third surface in contact with the second composite material.

In fifteenth examples, for any of the eleventh through fourteenth examples, the composite material is on the second surface of the heat spreader and the system further comprises a heat dissipation device having a third surface in contact with the second composite material.

In sixteenth examples, for any of the eleventh through fifteenth examples, the system further comprises a power supply electrically coupled to the microelectronic die.

In seventeenth examples, a method comprises applying a composite material over a microelectronic die, the composite material comprising a plurality of fill particles and a plurality of polymer chains, each of the plurality of fill particles comprising a hexagonal lattice of carbon atoms and one or more functional groups and curing the composite material to chemically bond at least a first polymer chain of the plurality of polymer chains to at least a first fill particle of the plurality of fill particles via a first functional group of the first fill particle.

In eighteenth examples, for any of the seventeenth examples, the plurality of fill particles comprise a plurality of graphene sheets, the composite material further comprises a plurality of carbon nanotubes, and said curing chemically bonds a second polymer chain of the plurality of polymer chains to at least a first carbon nanotube of the plurality of carbon nanotubes.

In nineteenth examples, for any of the seventeenth or eighteenth examples, said curing comprises curing the composite material during compression of the composite material at not less than 4 pounds per square inch.

In twentieth examples, for any of the seventeenth through nineteenth examples, said applying the composite material over the microelectronic die comprises applying the composite material on a surface of the microelectronic die and the method further comprises securing a first surface of a heat spreader to the composite material before, during, or after said curing the composite material, applying a second composite material on a second surface of the heat spreader opposite the first surface, the second composite material comprising a plurality of second fill particles and a plurality of second polymer chains, each of the plurality of second fill particles comprising a hexagonal lattice of carbon atoms and one or more functional groups, curing the second composite material to chemically bond at least a second polymer chain of the second plurality of polymer chains to at least a second fill particle of the second plurality of fill particles via a second functional group of the second fill particle, and securing a third surface of a heat dissipation device to the second composite material before, during, or after said curing the second composite material.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A microelectronic device, comprising:
   a microelectronic die; and
   a composite material to conduct heat from the microelectronic die, the composite material comprising a polymer chain chemically bonded to a fill particle comprising a hexagonal lattice of carbon atoms, wherein the fill particle comprises an amine functional group having a first nitrogen atom directly bonded to a first carbon atom of the hexagonal lattice of carbon atoms, and wherein the polymer chain is covalently bonded to the fill particle via a second nitrogen atom directly bonded to a second carbon atom of the hexagonal lattice of carbon atoms.

2. The microelectronic device of claim 1, wherein the fill particle comprises a graphene sheet or a carbon nanotube.

3. The microelectronic device of claim 1, wherein the polymer chain comprises a polydimethylsiloxane chain, an epoxy chain, or a polyurethane chain.

4. The microelectronic device of claim 3, wherein the polymer chain comprises the polyurethane chain covalently bonded to the fill particle via the second nitrogen atom.

5. The microelectronic device of claim 3, wherein the fill particle comprises a graphene sheet having a minimum cross sheet dimension of not less than 5 microns.

6. The microelectronic device of claim 1, wherein the composite material comprises fill particles in a bulk plurality of polymer chains, the fill particles each comprise a hexagonal carbon lattice, and the composite material comprises 20% to 30% of fill particles by volume.

7. The microelectronic device of claim 1, wherein the fill particle comprises a graphene sheet, the polymer chain comprises a first polymer chain of the composite material, and the composite material further comprises a second polymer chain covalently bonded to a carbon nanotube via a third nitrogen atom directly bonded to a third carbon atom of the carbon nanotube.

8. The microelectronic device of claim 7, wherein the composite material comprises graphene sheet fill particles and carbon nanotube fill particles in a bulk plurality of polymer chains, the composite material comprises 20% to 30% of graphene sheet fill particles by volume, and 1% to 10% of carbon nanotube fill particles by volume.

9. A system, comprising:
   a microelectronic die;
   a heat spreader having a first surface adjacent the microelectronic die and a second surface opposite the microelectronic die; and
   a composite material on one of the first surface or the second surface, the composite material comprising a polymer chain chemically bonded to a fill particle comprising a hexagonal lattice of carbon atoms, wherein the fill particle comprises an amine functional group having a first nitrogen atom directly bonded to a first carbon atom of the hexagonal lattice of carbon atoms, and wherein the polymer chain is covalently bonded to the fill particle via a second nitrogen atom directly bonded to a second carbon atom of the hexagonal lattice of carbon atoms.

10. The system of claim 9, wherein the composite material is between and in contact with both of the microelectronic die and the first surface of the heat spreader.

11. The system of claim 10, further comprising:
a second composite material on the second surface of the heat spreader, the second composite material comprising a second polymer chain chemically bonded to a second fill particle comprising a second hexagonal lattice of carbon atoms.

12. The system of claim 11, further comprising:
a heat dissipation device having a third surface in contact with the second composite material.

13. The system of claim 9, wherein the composite material is on the second surface of the heat spreader, the system further comprising
a heat dissipation device having a third surface in contact with the composite material.

14. The system of claim 9, further comprising:
a power supply electrically coupled to the microelectronic die.

15. A method, comprising:
applying a composite material over a microelectronic die, the composite material comprising a plurality of fill particles and a plurality of polymer chains, each of the plurality of fill particles comprising a hexagonal lattice of carbon atoms and one or more functional groups, wherein the one or more functional groups comprise a plurality of amine functional groups each having a nitrogen atom directly bonded to a corresponding carbon atom of the hexagonal lattice of carbon atoms; and
curing the composite material to chemically bond at least a first polymer chain of the plurality of polymer chains to at least a first fill particle of the plurality of fill particles via a first functional group of the first fill particle, wherein the first polymer chain is covalently bonded to the first fill particle via a first nitrogen atom directly bonded to a first carbon atom of the hexagonal lattice of carbon atoms.

16. The method of claim 15, wherein the plurality of fill particles comprise a plurality of graphene sheets, the composite material further comprises a plurality of carbon nanotubes, and said curing chemically bonds a second polymer chain of the plurality of polymer chains to at least a first carbon nanotube of the plurality of carbon nanotubes.

17. The method of claim 16, wherein said curing comprises curing the composite material during compression of the composite material at not less than 4 pounds per square inch.

18. The method of claim 15, wherein said applying the composite material over the microelectronic die comprises applying the composite material on a surface of the microelectronic die, the method further comprising:
securing a first surface of a heat spreader to the composite material before, during, or after said curing the composite material;
applying a second composite material on a second surface of the heat spreader opposite the first surface, the second composite material comprising a plurality of second fill particles and a plurality of second polymer chains, each of the plurality of second fill particles comprising a hexagonal lattice of carbon atoms and one or more functional groups;
curing the second composite material to chemically bond at least a second polymer chain of the second plurality of polymer chains to at least a second fill particle of the second plurality of fill particles via a second functional group of the second fill particle; and
securing a third surface of a heat dissipation device to the second composite material before, during, or after said curing the second composite material.

* * * * *